(12) United States Patent
Mikami et al.

(10) Patent No.: US 8,971,006 B2
(45) Date of Patent: Mar. 3, 2015

(54) ELECTRONIC CONTROL DEVICE INCLUDING INTERRUPT WIRE

(75) Inventors: Yuuki Mikami, Kariya (JP); Toru Itabashi, Anjo (JP); Takahiko Furuta, Kasugai (JP); Ryoichi Shiraishi, Obu (JP); Yusuke Takahashi, Kariya (JP); Hiroaki Nakamura, Nagaokakyo (JP); Shigeki Nishiyama, Nagaokakyo (JP)

(73) Assignees: DENSO CORPORATION, Kariya (JP); Murata Manufacturing Co., Ltd., Nagaokakyo-shi (JP)

( * ) Notice: Subject to any disclaimer, the term of this patent is extended or adjusted under 35 U.S.C. 154(b) by 425 days.

(21) Appl. No.: 13/362,562

(22) Filed: Jan. 31, 2012

(65) Prior Publication Data
US 2012/0200974 A1    Aug. 9, 2012

(30) Foreign Application Priority Data

Feb. 4, 2011 (JP) .................................. 2011-22927
Feb. 4, 2011 (JP) .................................. 2011-22928
Feb. 4, 2011 (JP) .................................. 2011-22930

(51) Int. Cl.
*H01H 85/08* (2006.01)
*H01H 85/10* (2006.01)
(Continued)

(52) U.S. Cl.
CPC ............... *H02H 5/047* (2013.01); *H01H 85/10* (2013.01); *H01H 85/046* (2013.01); *H01H 85/08* (2013.01);
(Continued)

(58) Field of Classification Search
CPC ...... H01H 85/08; H01H 85/10; H05K 1/0293
USPC .......................................... 361/837, 761, 104
See application file for complete search history.

(56) References Cited

U.S. PATENT DOCUMENTS 2,161,079 A * 6/1939 Muncheryan ................. 337/263
3,747,041 A * 7/1973 Cameron ....................... 337/159
(Continued)

FOREIGN PATENT DOCUMENTS

JP    U-52-168254    12/1977
JP    U-54-159163    11/1979
(Continued)

OTHER PUBLICATIONS

Office Action dated Oct. 28, 2013 issued in corresponding U.S. Appl. No. 13/362,497.
(Continued)

*Primary Examiner* — Zeev V Kitov
(74) *Attorney, Agent, or Firm* — Posz Law Group, PLC

(57) ABSTRACT

An electronic control device includes a substrate, a plurality of component-mounted wires, a plurality of electronic components, a common wire, an interrupt wire and a protective layer. The component-mounted wires and the common wire are disposed on the substrate. The electronic components are mounted on the respective component-mounted wires and are coupled with the common wire. The interrupt wire is coupled between one component-mounted wire and the common wire, and is configured to melt in accordance with heat generated by an overcurrent to interrupt a coupling between the component-mounted wire and the common wire. The protective layer covers a surface of the substrate including the interrupt wire and defines an opening portion so that at least a portion of the interrupt wire is exposed.

29 Claims, 32 Drawing Sheets

(51) Int. Cl.
*H02H 5/04* (2006.01)
*H05K 1/02* (2006.01)
*H01H 85/046* (2006.01)

(52) U.S. Cl.
CPC ............ *H05K 1/0265* (2013.01); *H05K 1/0293* (2013.01); *H05K 2201/09263* (2013.01); *H05K 2201/09727* (2013.01); *H05K 2201/09736* (2013.01); *H05K 2201/09781* (2013.01); *H05K 2201/0989* (2013.01); *H05K 2201/09909* (2013.01); *H05K 2201/10181* (2013.01)
USPC ............................. 361/104; 361/837; 361/761

(56) References Cited

U.S. PATENT DOCUMENTS

| | | | |
|---|---|---|---|
| 5,363,272 A | | 11/1994 | Tanaka et al. |
| 5,668,522 A | | 9/1997 | Kondo et al. |
| 5,752,047 A | * | 5/1998 | Darty et al. ............ 713/300 |
| 5,781,096 A | * | 7/1998 | Yasukuni et al. ........ 337/297 |
| 5,914,524 A | | 6/1999 | Komenaka |
| 6,163,244 A | | 12/2000 | Endo et al. |
| 6,933,591 B1 | * | 8/2005 | Sidhu et al. ............ 257/665 |
| 7,064,648 B2 | * | 6/2006 | Tanaka .................. 337/290 |
| 7,116,208 B2 | * | 10/2006 | Nishimura et al. ....... 337/296 |
| 7,124,390 B2 | * | 10/2006 | Smith et al. ............ 716/120 |
| 7,385,475 B2 | * | 6/2008 | Bender et al. ............ 337/297 |
| 8,659,384 B2 | * | 2/2014 | Dietsch et al. .......... 337/292 |
| 2003/0048620 A1 | | 3/2003 | Nishimura et al. |
| 2004/0184211 A1 | | 9/2004 | Bender et al. |
| 2008/0239684 A1 | | 10/2008 | Yamasaki |
| 2012/0200970 A1 | | 8/2012 | Itabashi et al. |
| 2012/0200972 A1 | | 8/2012 | Furuta et al. |
| 2012/0200973 A1 | | 8/2012 | Shiraishi et al. |
| 2012/0201010 A1 | | 8/2012 | Furuta et al. |

FOREIGN PATENT DOCUMENTS

| | | |
|---|---|---|
| JP | U-54-177551 | 12/1979 |
| JP | 55-14731 | 1/1980 |
| JP | U-55-14730 | 1/1980 |
| JP | U-55-108776 | 7/1980 |
| JP | S62-107341 U | 7/1987 |
| JP | S64-013650 U | 1/1989 |
| JP | A-H07-078547 | 3/1995 |
| JP | A-11-144604 | 5/1999 |
| JP | A-2000-003662 | 1/2000 |
| JP | A-2000-164992 | 6/2000 |
| JP | A-2002-140975 | 5/2002 |
| JP | A-2003-019933 | 1/2003 |
| JP | A-2003-173730 | 6/2003 |
| JP | A-2004-158377 | 6/2004 |
| JP | A-2006-114606 | 4/2006 |
| JP | 2007095592 A | 4/2007 |
| JP | A-2007-311467 | 11/2007 |
| JP | A-2008-060381 | 3/2008 |

OTHER PUBLICATIONS

Office Action mailed Nov. 19, 2013 in the corresponding JP application No. 2013-001731, which is the Divisional Application of JP No. 2011-022927.
Office Action mailed Nov. 13, 2012 in corresponding JP Application No. 2011-022924 (and English translation).
Office Action mailed Nov. 13, 2012 in corresponding JP Application No. 2011-022931 (and English translation).
Office Action mailed Nov. 13, 2012 in corresponding JP Application No. 2011-022927 (and English translation).
Office Action mailed Nov. 13, 2012 in corresponding JP Application No. 2011-022928 (and English translation).
Office Action mailed Nov. 13, 2012 in corresponding JP Application No. 2011-022930 (and English translation).
Office Action mailed Jul. 2, 2013 issued in corresponding JP patent application No. 2011-022929 (and English translation).
Office Action mailed Jul. 2, 2013 issued in corresponding JP patent application No. 2011-022925 (and English translation).
Office Action mailed Jul. 2, 2013 issued in corresponding JP patent application No. 2011-022931 (and English translation).
Office Action mailed Jul. 23, 2013 in the corresponding JP application No. 2013-002744, which is Division Application of JP No. 2011-022928 (English translation).
Office Action mailed Sep. 17, 2013 in corresponding JP Application No. 2013-002745 (and English translation).
Office Action mailed Feb. 7, 2014 in the corresponding CN application No. 201210025379.2 (and English Translation).
Office Action mailed Nov. 13, 2012 in corresponding JP Application No. 2011-022929 (and English translation).
Office Action mailed Nov. 13, 2012 in corresponding JP Application No. 2011-022926 (and English translation).
Office Action mailed Nov. 13, 2012 in corresponding JP Application No. 2011-022925 (and English translation).
Office Action dated Jul. 14, 2014 issued in corresponding CN patent application No. 201210025379.2 (and English translation).

* cited by examiner

ELECTRONIC CONTROL DEVICE INCLUDING INTERRUPT WIRE

CROSS REFERENCE TO RELATED APPLICATIONS

The present application is based on and claims priority to Japanese Patent Applications No. 2011-22927 filed on Feb. 4, 2011, No. 2011-22928 filed on Feb. 4, 2011, and No. 2011-22930 filed on Feb. 4, 2011, the disclosures of which are incorporated herein by reference.

TECHNICAL FIELD

The present disclosure relates to an electronic control device including an interrupt wire for overcurrent protection.

BACKGROUND

Conventionally, an electronic control device includes a fuse in case of a fault in the electronic control device. In an electronic control device in which small components are densely arranged, because a short-circuit current generated at a short-circuit fault in the small components does not reach a high current, it takes a long time to interrupt by the fuse. Especially when a large fuse is used for protecting a plurality of electronic control devices so as to reduce the number of fuses and a cost, it takes a longer time. Thus, temperatures of the components may be increased at an interruption and a voltage drop in a power supply wire and the like may be caused for a long time. In contrast, in a common wire, such as a power supply wire (e.g., a battery path and a ground path), that supplies electric power required for operating many circuits and many components mounted in accordance with advancement and diversification of electronic control, a relatively high current flows. Thus, an interrupting current of a large fuse disposed in a common wire path is further increased, and the electronic control device does not secure a sufficient interrupt performance at a short-circuit fault in each circuit or each component. The above-described issue becomes noticeable, for example, in an electronic control device for a vehicle used at a higher temperature and including many mounted devices.

JP-A-2007-311467 discloses a printed circuit board control device in which an interrupt wire is disposed in a power supply wire in each substrate. If an overcurrent flows, the interrupt wire melts and the power supply wire is interrupted in each substrate or each device.

On a substrate in which components are densely mounted, a component-mounted wire, such as a land, on which an electronic component is mounted, and a common wire shared by a plurality of electronic components including the electronic component are disposed adjacent to each other. Thus, usually, a protective layer made of, for example, solder resist is formed on a wire section except a component-coupling portion in the wire. The protective layer is also formed on an interrupt wire disposed between the component-mounted wire and the common wire.

The interrupt wire melts in accordance with heat generated by an overcurrent, and a melt conductor generated by melting of the interrupt wire completely melts down by, such as, expand. Thus, the interrupt wire interrupts the coupling between the component-mounted wire and the common wire. In the above-described interrupt wire, a portion of the melt conductor may not diffuse favorably and may stay. Accordingly, a melt position and a melting time may vary and an interrupt performance of the interrupt wire may be decreased.

In order to form a predetermined pattern for a wire section including an interrupt wire on a substrate in which components are densely mounted, generally, predetermined portions of a conductive layer are covered with resist and the substrate is dipped into an etching liquid. The predetermined portions correspond to the predetermined pattern for the wire section. Thus, the predetermined portions covered with resist are left and other portions are removed by etching.

However, the etching liquid is less likely to flow uniformly at a region around the interrupt wire due to a pattern shape of the wire section. Therefore, the region around the interrupt wire is less likely to be etched, and a wire width of the interrupt wire may vary. In contrast, when the etching liquid is less likely to flow uniformly at the region around the interrupt wire and stays at the region, the region is etched more than necessary and the wire width of the interrupt wire may vary. Thus, a melt position of the interrupt wire and a melting time of the interrupt wire may vary and an interrupt performance of the interrupt wire may be decreased. Specifically, compared with other wires, the interrupt wire is required to have a narrower width at a connecting portion of the interrupt wire and another wire. Thus, a decrease in an interrupt performance of the interrupt wire is more significant at the connecting portion of the interrupt wire and another wire.

Furthermore, when an interrupt wire melts down in accordance with heat generated by an overcurrent, a melt conductor generated by melting of the interrupt wire may break a protective layer that covers the substrate and may flow on the substrate. Thus, electronic components and circuits around the melt conductor may be adversely affected by the melt conductor. Specifically, the melt conductor may cause a short-circuit fault at a densely patterned wire section. Additionally, in a case where the melt conductor adheres to a connecting portion of the substrate and an electronic component, the melt conductor may cause a defect in coupling of the electronic component by melting the solder, which is used to couple the electronic component to the substrate and has a relatively low melting temperature.

SUMMARY

In view of the foregoing problems, it is an object of the present disclosure to provide an electronic control device which can restrict a decrease in an interrupt performance due to an interrupt wire.

An electronic control device according to a first aspect of the present disclosure includes a substrate, a plurality of component-mounted wires, a plurality of electronic components, a common wire, an interrupt wire and a protective layer. The component-mounted wires and the common wire are disposed on the substrate. The electronic components are mounted on the respective component-mounted wires. The common wire is coupled with each of the electronic components. The interrupt wire is coupled between one of the component-mounted wires and the common wire, and is configured to melt in accordance with heat generated by an overcurrent so as to interrupt a coupling between the one of the component-mounted wires and the common wire via the interrupt wire. The protective layer covers a surface of the substrate including the interrupt wire and defines an opening portion so that at least a portion of the interrupt wire is exposed.

In the above electronic control device, when the interrupt wire melts in accordance with the heat generated by the overcurrent, a melt conductor generated by melting of the interrupt wire flows from the opening portion. Thus, the melt conductor is less likely to stay at a position of the interrupt wire, and a decrease in an interrupt performance due to the interrupt wire can be restricted.

An electronic control device according to a second aspect of the present disclosure includes a substrate, a coupling object, a connection wire and an interrupt wire. The coupling object is mounted on the substrate. The interrupt wire is coupled with the coupling object via the connection wire, and is configured to melt in accordance with heat generated by an overcurrent so as to interrupt a coupling with the coupling object. Each side end of the connection wire is smoothly connected with corresponding side end of the interrupt wire and a wire width of the connection wire increases toward the coupling object.

In the above electronic control device, when the connection wire and the interrupt wire are formed using etching liquid, the etching liquid can uniformly flow at connecting portions of the connection wire and the interrupt wire. Thus, the etching liquid is less likely to stay at the connecting portions and a variation in the wire width of the interrupt wire can be restricted. Accordingly, a decrease in an interrupt performance due to the interrupt wire can be restricted.

An electronic control device according to a third aspect of the present disclosure includes a substrate, a coupling object, an interrupt wire, a first etching resist region and a second etching resist region. The coupling object is mounted on the substrate. The interrupt wire is configured to melt in accordance with heat generated by an overcurrent so as to interrupt a coupling with the coupling object. The interrupt wire has a first side end and a second side end facing to each other. The first etching resist region is disposed adjacent to the first side end of the interrupt wire, and the second etching resist region is disposed adjacent to the second side end of the interrupt wire. A distance between the first etching resist region and the first side end is equal to a distance between the second etching resist region and the second side end.

In the above electronic control device, since a volume of an etching liquid flow at the first side end is equal to a volume of an etching liquid flow at the second side end, a variation in etching speeds at the first side end and the second side end can be restricted. Accordingly, a variation in a wire width of the interrupt wire can be restricted, and a decrease in an interrupt performance due to the interrupt wire can be restricted.

BRIEF DESCRIPTION OF THE DRAWINGS

Additional objects and advantages of the present disclosure will be more readily apparent from the following detailed description when taken together with the accompanying drawings. In the drawings.

DETAILED DESCRIPTION (First Embodiment)

Figure 1:
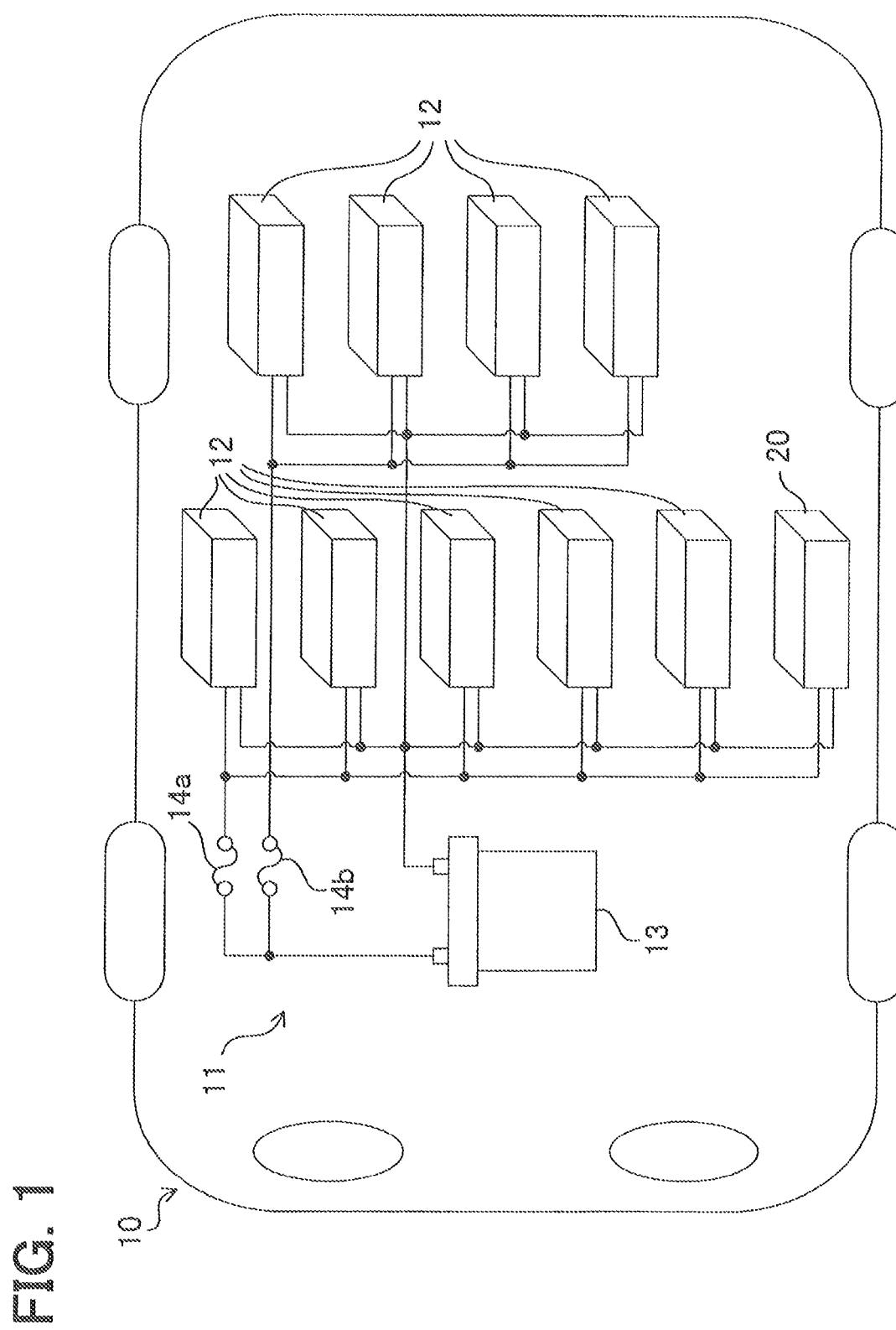
FIG. 1 is a block diagram showing a vehicle control system including a traction control device according to a first embodiment of the present disclosure.

An electronic control device according to a first embodiment of the present disclosure will be described with reference to drawings. The electronic control device according to the present embodiment can be suitably used as a traction control device 20 included in a vehicle control system 11. As shown in FIG. 1, the vehicle control system 11 includes a plurality of electronic control devices 12 that include the traction control device 20, an engine electronic control unit (ECU), a brake ECU, a steering ECU, a body ECU, a navigation device, and the like.

The traction control device 20 restricts an acceleration slip of a driving wheel. In a vehicle control such as a running control, the traction control device 20 is less important than other electronic control devices.

The electronic control devices 12 including the traction control device 20 are electrically coupled with a battery 13 via one of fuses 14a, 14b used for overcurrent protection. The battery 13 is a direct-current power source. Because each of the fuses 14a, 14b is disposed on a power supply path for supplying electric power to many electronic control devices, each of the fuses 14a, 14b may be a large fuse for 15 A or 20 A. When one of the electronic control devices 12 coupled with the fuse 14a has abnormality and an overcurrent greater than a predetermined current value is generated, the fuse 14a blows out by the overcurrent, and a power supply via the fuse 14a is interrupted. Thus, an adverse influence to the other electronic control devices 12 can be restricted. In an example shown in FIG. 1, each of the electronic control devices 12 is electrically coupled with the battery 13 via one of the fuses 14a, 14b. However, all the electronic control devices 12 may also be electrically coupled with the battery 13 via a single fuse, or each of the electronic control devices 12 may also be electrically coupled with the battery 13 via one of more than two fuses.

The traction control device 20 according to the present embodiment will be described with reference to FIG. 2 to FIG. 4.

The traction control device 20 includes a plurality of electronic components 22 for restricting an acceleration slip. The electronic components 22 are densely-mounted on a circuit substrate 21. The circuit substrate 21 is electrically coupled with an external device and other electronic control devices 12 via, for example, a connector, and restricts an acceleration slip of the driving wheel based on a predetermined signal.

Each of the electronic components 22 on the circuit substrate 21 is electrically coupled with the power supply wire 23. The power supply wire 23 is coupled with the battery 13 by the power supply path via the fuse 14a and supplies electric power from the battery 13 to each of the electronic components 22. Thus, the power supply wire 23 is an example of a common wire shared by the electronic components 22.

Figure 2:
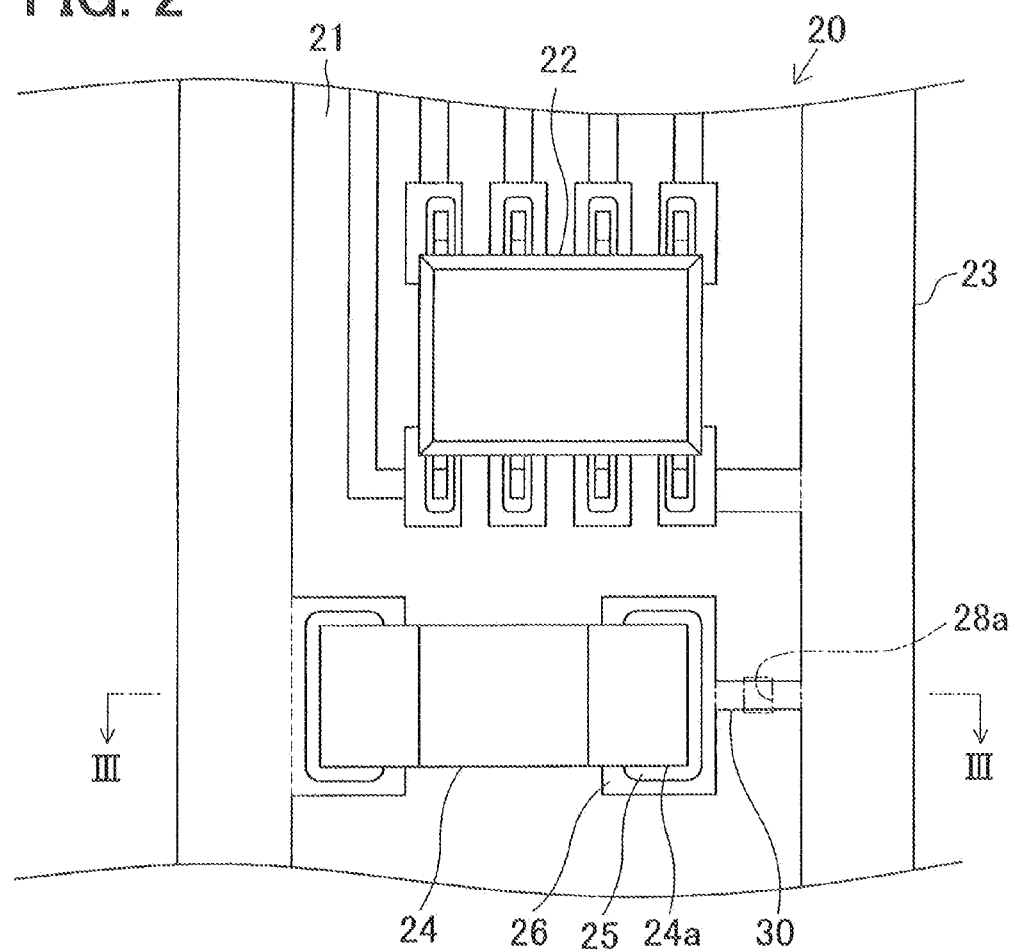
FIG. 2 is a diagram showing a part of the traction control device according to the first embodiment.
Figure 3:
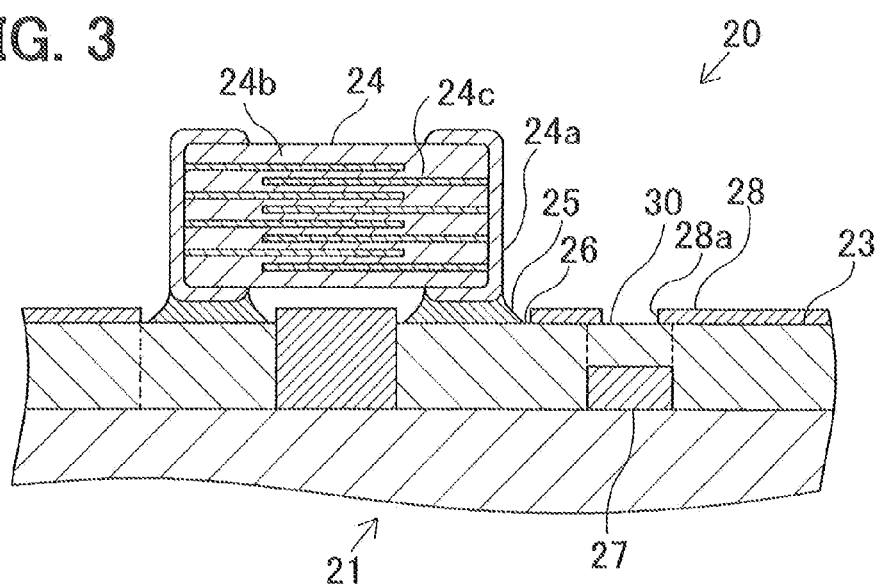
FIG. 3 is a cross-sectional view of the traction control device taken along line III-III in FIG. 2.
Figure 4:
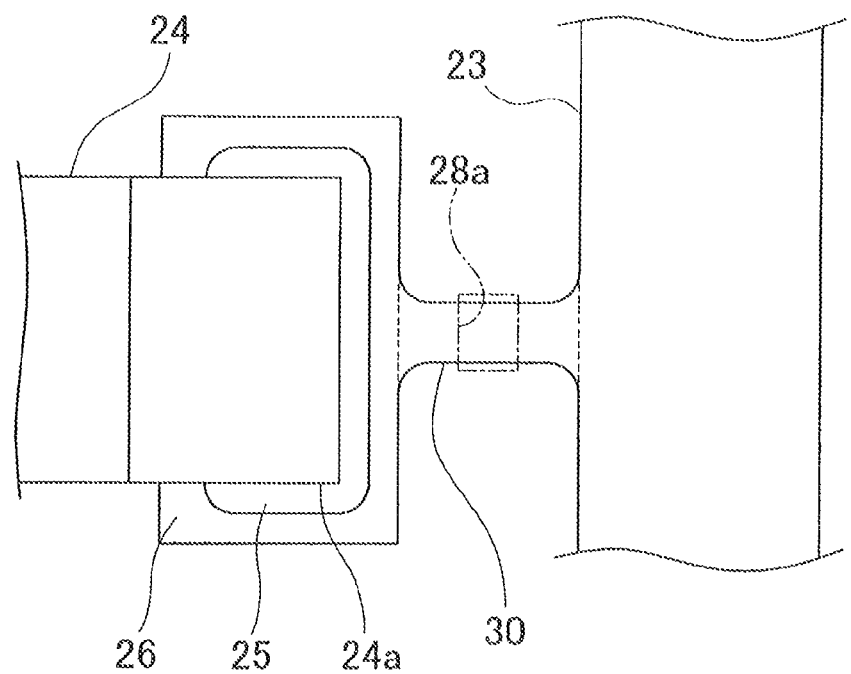
FIG. 4 is an enlarged view of a portion around an interrupt wire of the traction control device shown in FIG. 2.

As shown in FIG. 2 and FIG. 3, one of the electronic components 22 on the circuit substrate 21 is a ceramic capacitor 24. The ceramic capacitor 24 may be formed by stacking a high-permittivity ceramic 24b made of barium titanate and an internal electrode 24c in layers for improving temperature characteristics and frequency characteristics, and thereby having a large capacity with a small size.

The ceramic capacitor 24 has outside electrodes 24a on either ends thereof. The outside electrodes 24a are mounted on respective lands 26 via solders 25. An interrupt wire 30 is disposed between one of the lands 26 and the power supply wire 23. The interrupt wire 30 melts by heat generated by an overcurrent and interrupts the electric coupling between the land 26 and the power supply wire 23 via the interrupt wire 30. Thus, the interrupt wire 30 can achieve an overcurrent protection depending on the circuit substrate 21. In FIG. 3, thicknesses of wires, such as an interrupt wire 30, are shown in a magnified way.

The interrupt wire 30 has a wire width sufficiently smaller than a wire width of the power supply wire 23. The wire width means a dimension in a direction that is perpendicular to a direction of electric current on a surface of the circuit substrate 21. For example, the interrupt wire 30 has a wire width within a range from 0.2 mm to 0.3 mm, and the power supply wire 23 has a wire width of 2 mm. The lands 26 can work as component-mounted wires.

As shown in FIG. 3, the interrupt wire 30 has a wire thickness thinner than a wire thickness of the power supply wire 23 and wire thicknesses of the lands 26. The wire thickness means a dimension in a direction that is perpendicular to the circuit substrate 21. At an internal portion of the interrupt wire 30, a heat transmission restriction member 27 is disposed. The heat transmission restriction member 27 is made of, for example, resist material, which is used to protect the surface of the circuit substrate 21. The interrupt wire 30 is easily shaped to have the thinner thickness by disposing the heat transmission restriction member 27 at the internal portion of the interrupt wire 30 during shape formation of the interrupt wire 30.

As shown in FIG. 3, a solder resist layer 28, which functions as a protective layer to protect the surface of the circuit substrate 21 defines an opening portion 28a so that the opening portion 28a has a rectangular shape and at least a portion of the interrupt wire 30 is exposed outside. Specifically, the solder resist layer 28 defines the opening portion 28a in such a manner that a middle portion of an entire length of the interrupt wire 30, which is most likely to generate heat, is exposed outside. In FIG. 2 and FIG. 4, the solder resist layer 28, which covers a substrate surface and defines the opening portion 28a, is not shown for convenience.

Reasons of providing the opening portion 28a will be described with reference to FIG. 5 and FIG. 6.

Figure 5:
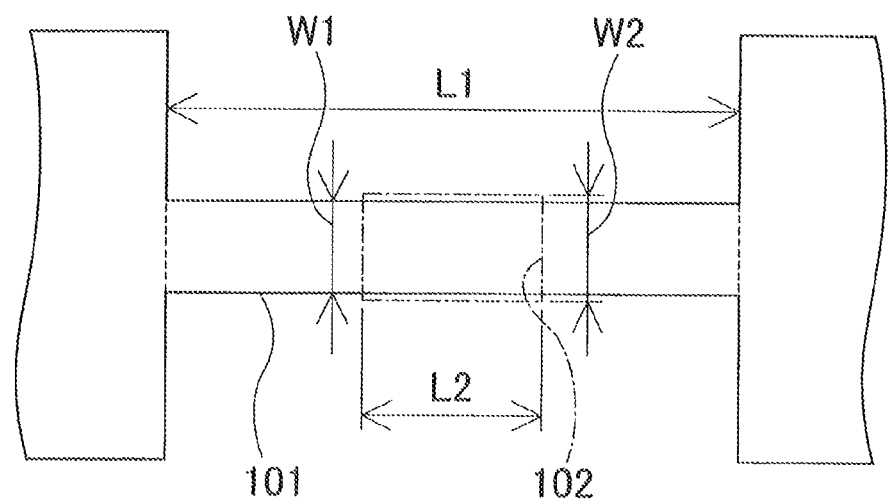
FIG. 5 is a diagram showing a device including a test interrupt wire and a test opening portion.

In a device shown in FIG. 5, a part of a test interrupt wire 101 is exposed outside through a test opening portion 102 defined by a solder resist layer 28. The test interrupt wire 101 is supplied with a predetermined current, and an interrupting current I with which the test interrupt wire 101 melts and a melting time t when the test interrupt wire 101 melts are measured. Furthermore, an interrupting current I and a melting time t of a test interrupt wire 101 in a case where a solder resist layer 28 does not define a test opening portion 102 are also measured. The test interrupt wire 101 has an entire length L1 of 2.85 mm and has a width W1 of 0.25 mm. The test opening portion 102 has an opening length L2 of 0.6 mm in a direction parallel to a length direction of the test interrupt wire 101 and has an opening width W2 of 0.25 mm in a width direction of the test interrupt wire 101. In FIG. 5, the opening width W2 is drawn as being longer than the width W1 for convenience of drawing.

Figure 6:
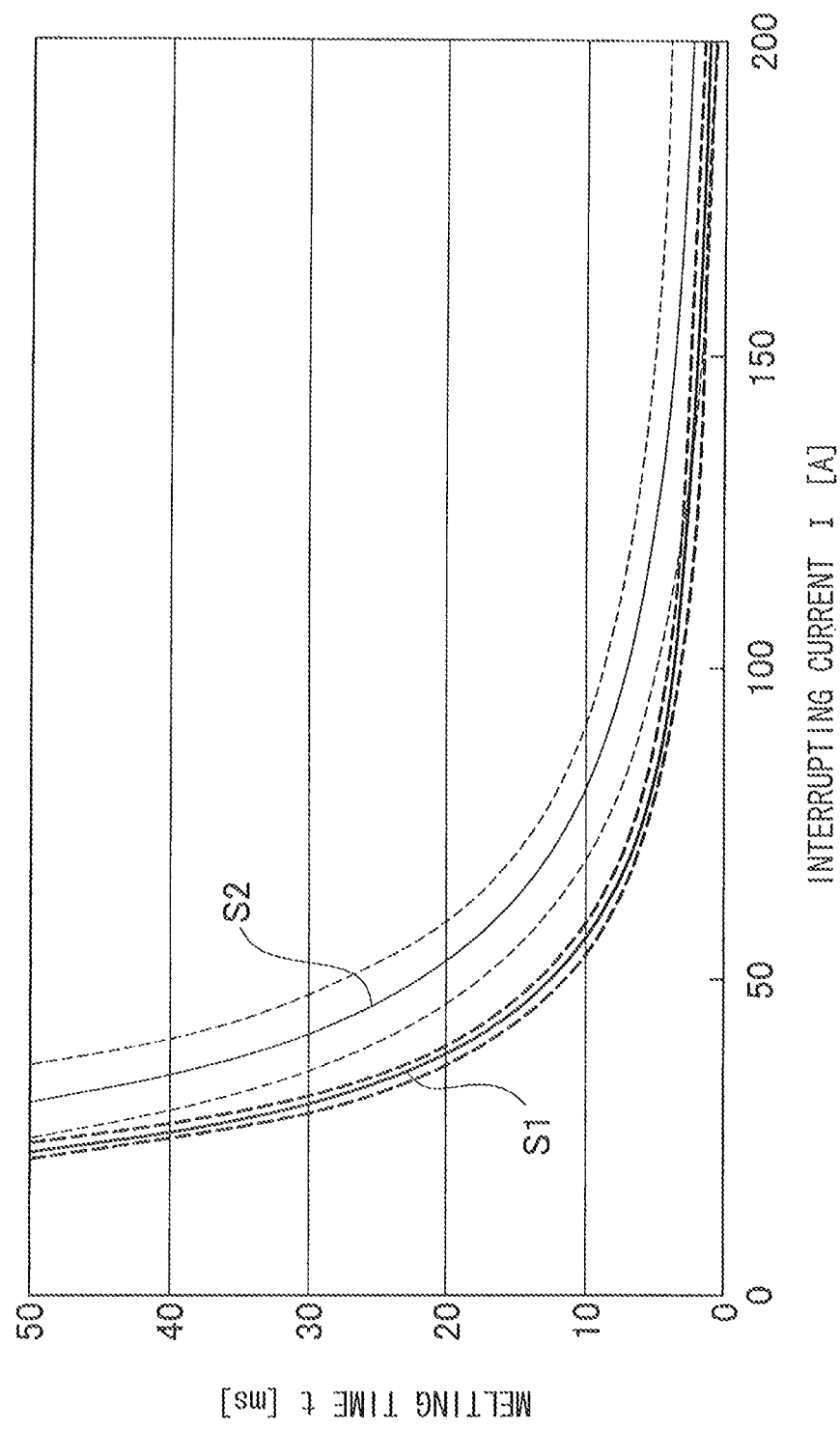
FIG. 6 is a graph showing a relationship between an interrupting current and a melting time of the test interrupt wire in each case where the test opening portion is defined and where the test opening portion is not defined.

In FIG. 6, a bold solid line S1 shows a relationship between the interrupting current I and the melting time t of the test interrupt wire 101, a part of which is exposed through the test opening portion 102, and a range between bold dashed lines centered on the bold solid line S1 shows a variation range of the melting time t with respect to the interrupting current I. A thin solid line S2 shows a relationship between the interrupting current I and the melting time t of the test interrupt wire 101 in a case where a test opening portion 102 is not defined, and a range between thin dashed lines centered on the thin solid line S2 shows a variation range of the melting time t with respect to the interrupting current I.

As shown in FIG. 6, at the same interrupting current, the melting time t decreases and the variation range decreases when the test opening portion 102 is defined by the solder resist layer 28. In contrast, in the case where the test opening portion 102 is not defined by the solder resist layer 28, the melting time t of the test interrupt wire 101 increases in each overcurrent range and the variation range increases compared with the case where the test opening portion 102 is defined. This is because a melt conductor generated by melting of the test interrupt wire 101 flows from the test opening portion 102 and the melt conductor is less likely to stay at a position of the test interrupt wire 101 before melting.

Thus, when at least a part of the interrupt wire 30 is exposed through the opening portion 28a, the melting time t decreases, the overcurrent protection action can be achieved early, and a temperature rise of a protected component can be restricted. Furthermore, a time for which a voltage of the power supply wire 23 decreases due to interruption by the interrupt wire 30 can be reduced. In addition, because the variation of the melting time t decreases, a capacity of a stabilizing capacitor that is designed in view of the melting time of the interrupt wire 30 in each device or each circuit can be reduced, and a cost and a size can be reduced. Furthermore, because the melting time t decreases also in a rated region of current, a circuit can be designed more freely.

In the traction control device 20 having the above-described configuration, for example, when a short-circuit fault occurs in the ceramic capacitor 24 and an overcurrent flows in the interrupt wire 30, the interrupt wire 30 generates heat in accordance with the overcurrent. When the generated heat becomes greater than a predetermined temperature, the interrupt wire 30 melts, and the electric coupling via the interrupt wire 30 is interrupted. Accordingly, the other electronic components 22 coupled with the power supply wire 23 can be protected against the overcurrent. The current at interruption is not high enough to blow the fuse 14a. Thus, the damage of the traction control device 20 does not influence to the other electronic control devices 12 supplied with power via the fuse 14a. A time from generation of the overcurrent to the melting of the interrupt wire 30 is a few milliseconds, and a melting time of each of the fuses 14a, 14b is generally about 0.02 seconds. Thus, the overcurrent protection can be appropriately achieved even to an electronic control device or an electronic component that is required to improve a processing speed.

In the traction control device 20 according to the present embodiment, when the interrupt wire 30 melts in accordance with heat generated by the overcurrent, a melt conductor generated by melting of the interrupt wire 30 flows from the opening portion 28a. Accordingly, the melt conductor is less likely to stay at a position of the interrupt wire 30 before melting, variations in the melt position and the melting time due to stay of the melt conductor can be restricted, and a decrease in an interrupt performance by the interrupt wire 30 can be restricted.

Further, the opening portion 28a is defined by the solder resist layer 28 in such a manner that the interrupt wire 30 is exposed outside at a portion, which is most likely to generate heat. That is, the opening portion 28a is defined at a portion, which is most likely to melt in the interrupt wire 30. Thus, the decrease in the interrupt performance by the interrupt wire 30 can be restricted with certainty.

The power supply wire 23 is coupled with the battery 13, which supplies power not only to the traction control device 20 but also to other electronic control devices 12, by the power supply path, and the fuse 14a for protecting the traction control device 20 and other electronic control devices 12 is disposed on the power supply path. Even when a short-circuit fault occurs in the traction control device 20 including the interrupt wire 30, the interrupt wire 30 melts. Thus, influence of the short-circuit fault on the power supply to other electronic control devices 12 can be restricted.

Figure 7:
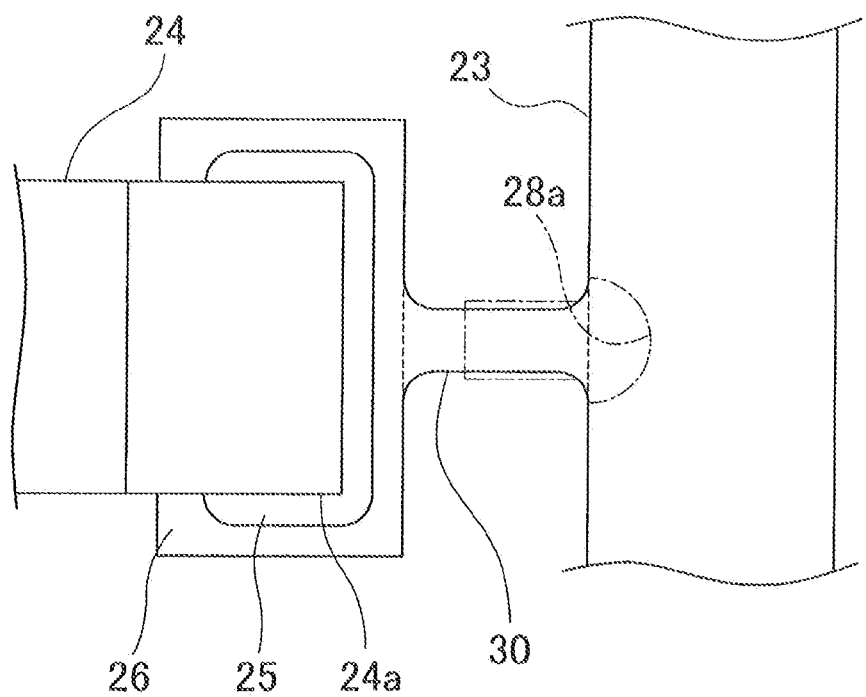
FIG. 7 is a diagram showing a part of a traction control device according to a first modification of the first embodiment.

A traction control device 20 according to a first modification of the first embodiment will be described with reference to FIG. 7. As shown in FIG. 7, the opening portion 28a may be defined by the solder resist layer 28 in such a manner that not only at least a portion of the interrupt wire 30 but also a portion of the power supply wire 23 is exposed outside through the opening portion 28a. In this case, the melt conductor generated by melting of the interrupt wire 30 is likely to adhere to the portion of the power supply wire 23 exposed through the opening portion 28a, Accordingly, the melt conductor is less likely to stay, and the melt conductor of high temperature is less likely to flow from the opening portion 28a and to influence other electronic components 22.

Figure 8:
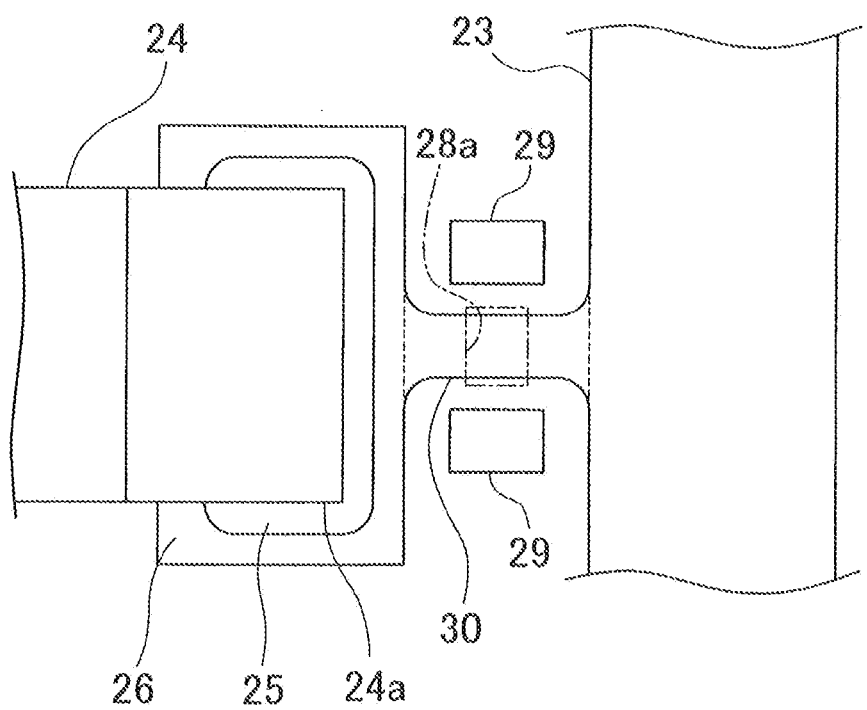
FIG. 8 is a diagram showing a part of a traction control device according to a second modification of the first embodiment.

A traction control device 20 according to a second modification of the first embodiment will be described with reference to FIG. 8. As shown in FIG. 8, a pair of adherent wires 29 may be disposed adjacent to the interrupt wire 30. Specifically, a distance between the interrupt wire 30 and one of the adherent wires 29 is shorter than a distance between the interrupt wire 30 and any of electronic components 22 except for the capacitor 24 mounted on the lands 26. The adherent wire 29 can work as an adherent member or an adsorption member to which the melt conductor generated by melting of the interrupt wire 30 adheres. The adherent wires 29 may be made of the same material as the power supply wire 23. When the melt conductor of the high temperature is generated by melting of the interrupt wire 30 and flows from the opening portion 28a, the melt conductor flow on the surface of the circuit substrate 21 and adheres to the adherent wires 29 adjacent to the interrupt wire 30.

Accordingly, the melt conductor is held by the adherent wire 29 and loses flowability by releasing heat and being hardened. Thus, the decrease in the interrupt performance by the interrupt wire 30 can be restricted, and adverse effect of the flow of the melt conductor on other electronic components can be restricted.

Figure 9:
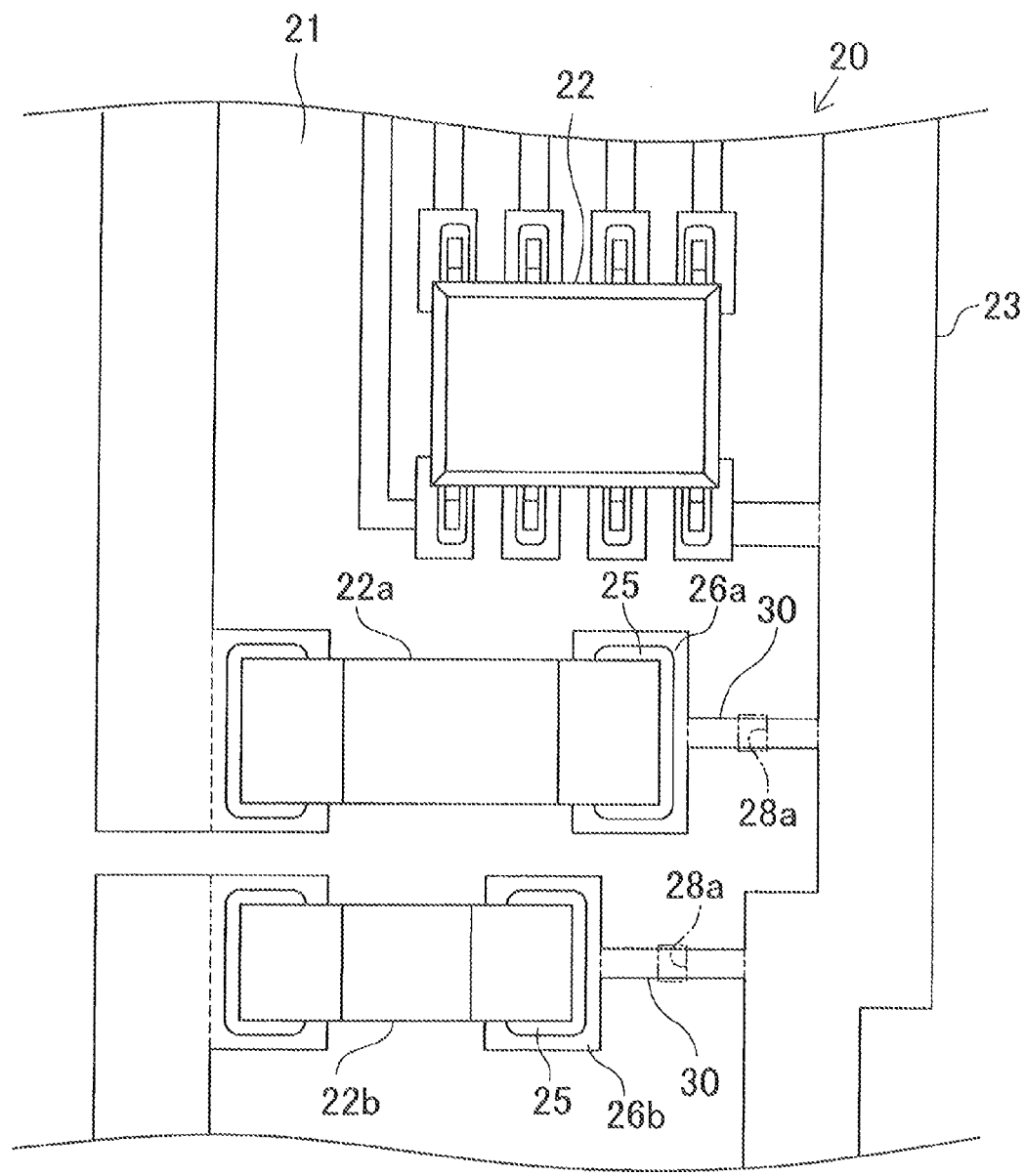
FIG. 9 is a diagram showing a part of a traction control device according to a third modification of the first embodiment.

A traction control device according to a third modification of the first embodiment will be described with reference to FIG. 9. As shown in FIG. 9, a plurality of interrupt wires 30 may be disposed for a plurality of electronic components 22, respectively. In each of the interrupt wires 30, the opening portion 28a is defined so that at least a portion of the interrupt wire 30 is exposed outside. Specifically, an interrupt wire 30 may be coupled between one of lands 26a of an electronic component 22a and the power supply wire 23, and another interrupt wire 30 may be coupled between one of lands 26b of an electronic component 22b and the power supply wire 23. The opening portions 28a are defined with respect to the interrupt wires 30 in such a manner that the middle portions of the entire lengths of the interrupt wires 30, which are most likely to generate heat, are exposed outside.

Figure 10:
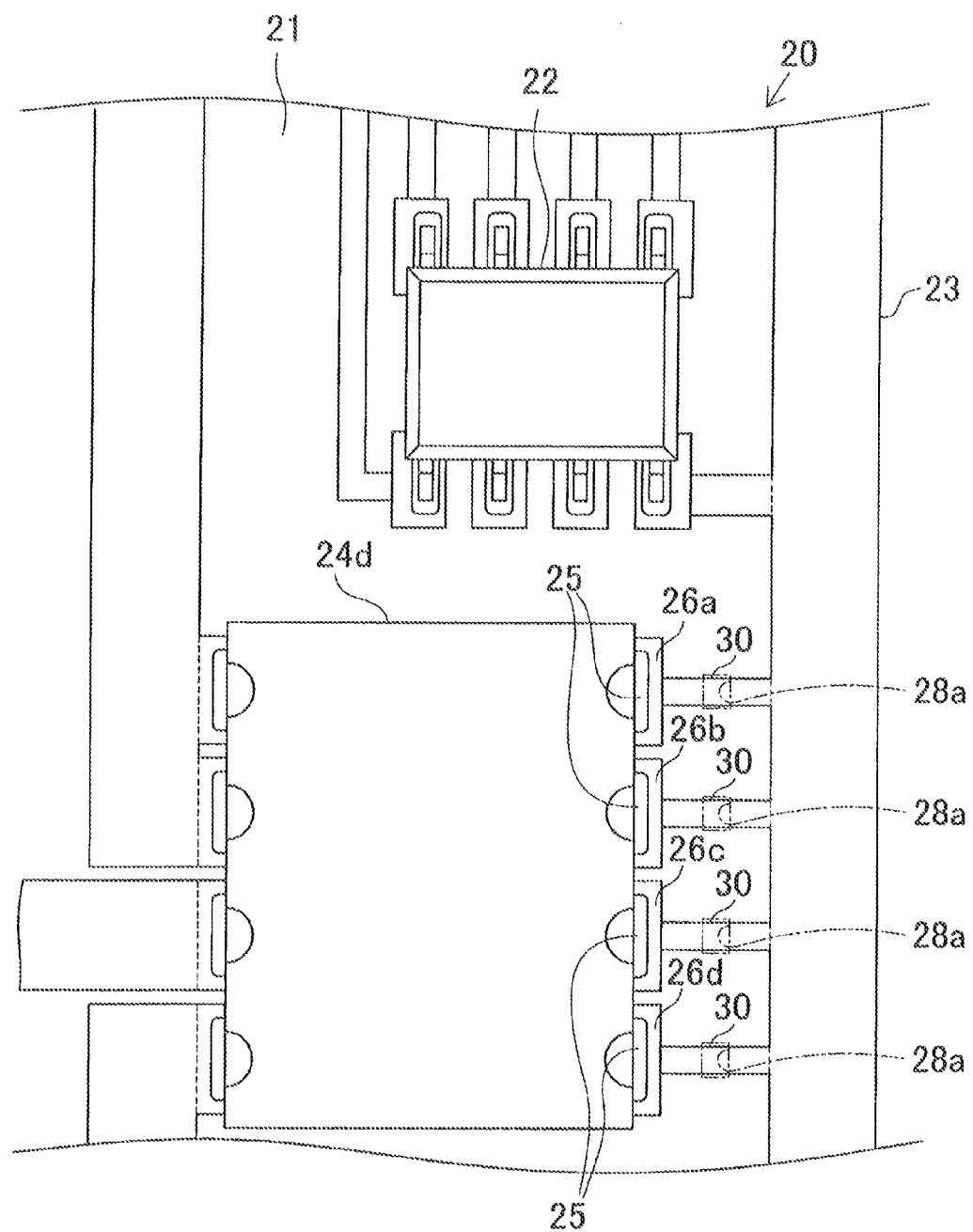
FIG. 10 is a diagram showing a part of a traction control device according to a fourth modification of the first embodiment.

A traction control device according to a fourth modification of the first embodiment will be described with reference to FIG. 10. As shown in FIG. 10, a plurality of interrupt wires 30 may be coupled between an array-type ceramic capacitor 24d having a plurality of external electrodes and the power supply wire 23 in such a manner that each of the external electrodes of the ceramic capacitor 24 is coupled with the power supply wire 23 via one of the interrupt wires 30. In each of the interrupt wires 30, an opening portion 28a is defined so that at least a portion of the interrupt wire 30 is exposed outside. The ceramic capacitor 24d is formed by arraying four multilayer capacitors in a package. In the traction control device 20 according to the present modification, the ceramic capacitor 24 has four external electrodes respectively coupled to four lands 26a to 26d, and each of the interrupt wires 30 is coupled between corresponding land 26a to 26d and the power supply wire 23.

As described above, in a case where the opening portions 28a are defined with respect to each of the interrupt wires 30, the melt conductor is less likely to stay at positions of the interrupt wires 30. Thus, the decrease in the interrupt performance by the interrupt wires 30 disposed on the densely mounted circuit substrate 21 can be restricted.

(Second Embodiment)

A traction control device 20a according to a second embodiment of the present disclosure will be described with reference to FIG. 11.

In the traction control device 20a according to the present embodiment, an interrupt wire 30a is disposed on the circuit substrate 21 instead of the interrupt wire 30.

Figure 11:
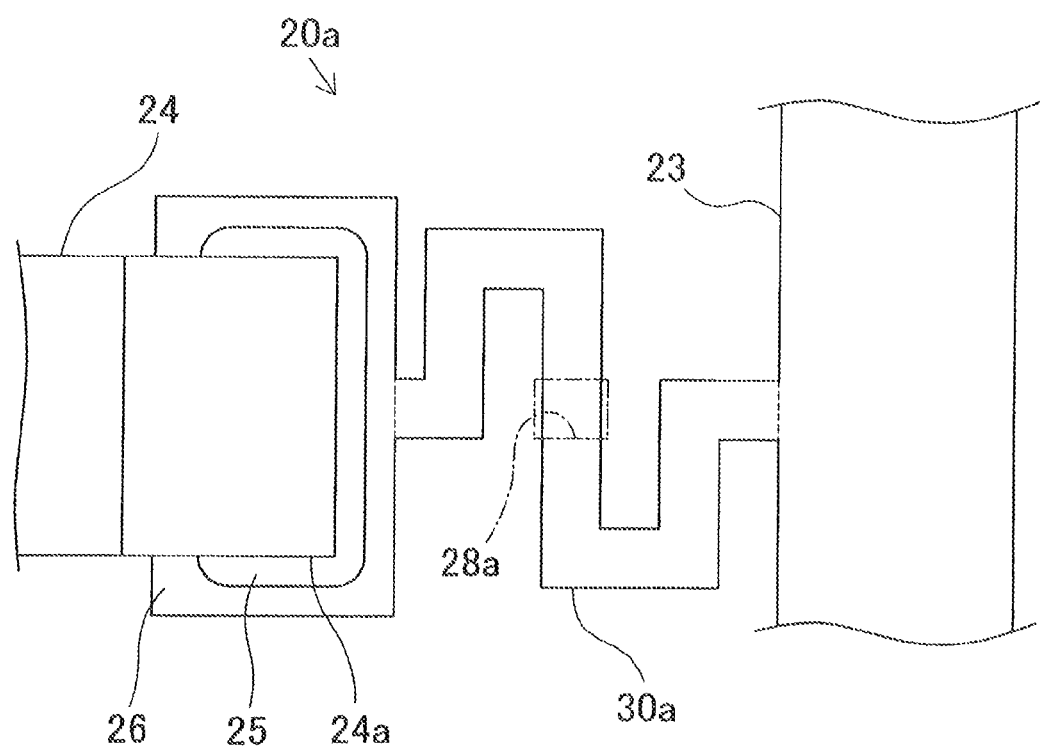
FIG. 11 is a diagram showing a part of a traction control device according to a second embodiment of the present disclosure.

As shown in FIG. 11, the interrupt wire 30a has a meandering shape to secure a required wire length of the interrupt wire 30a in a limited mounting area. The opening portion 28a is defined by the solder resist layer 28 in such a manner that a middle portion of an entire length of the interrupt wire 30a is exposed outside.

As described above, even on a densely mounted circuit substrate 21, because the interrupt wire 30a can be shaped thin and long, the required wire length of the interrupt wire 30a is easily secured. Specifically, the opening portion 28a is defined so that the middle portion of the entire length of the interrupt wire 30a, which is most likely to generate heat, is exposed outside through the opening portion 28a. Thus, in the interrupt wire 30a that has the meandering shape, stay of the melt conductor can be restricted with certainty, and the decrease in the interrupt performance by the interrupt wire 30a can be restricted with certainty. The above-described configuration of the interrupt wire 30a may be applied to other embodiments and modifications.

(Third Embodiment)

A traction control device 20b according to a third embodiment of the present disclosure will be described with reference to FIG. 12A and FIG. 12B.

In the traction control device 20b according to the present embodiment, opening portions 28b are defined by the solder resist layer 28.

Figure 12A:
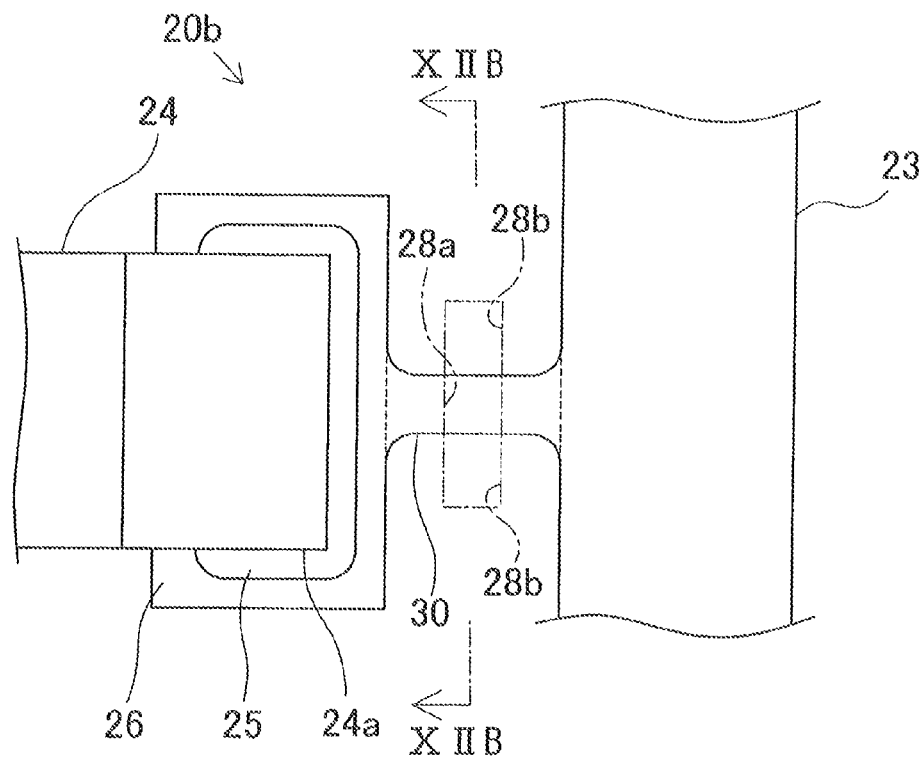
FIG. 12A is a diagram showing a part of a traction control device according to a third embodiment of the present disclosure and FIG. 12B is a cross-sectional view of the traction control device taken along line XIIB-XIIB in FIG. 12A.
Figure 12B:
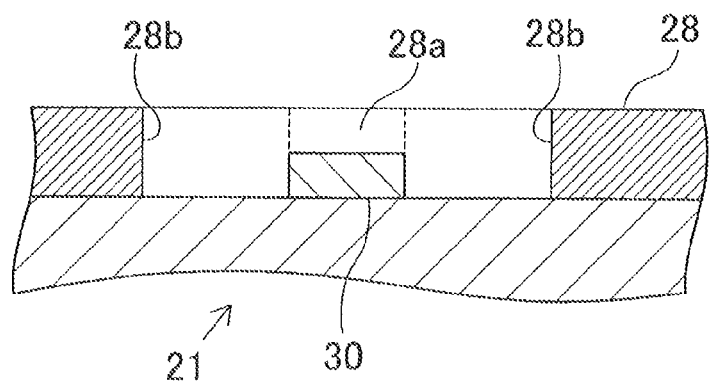

As shown in FIG. 12A and FIG. 12B, in addition to the opening portion 28a, the solder resist layer 28 may also define opening portions 28b in such a manner that a portion of the solder resist layer 28 adjacent to the interrupt wire 30 is exposed and the opening portions 28b are communicated with the opening portion 28a. The opening portions 28b function as second opening portions. For example, the opening portions 28b may be formed by removing a portion of the solder resist layer 28, where a wire section is not formed in a transversely direction (upper to lower direction in FIG. 12A) of the interrupt wire 30, so as to be communicated with the opening portion 28a. As shown in FIG. 12B, the solder resist layer 28 has a layer thickness of, for example, 68 µm and the interrupt wire 30 has a wire thickness of, for example, 43 µm. The layer thickness of the solder resist layer 28 is equal to a depth of each of the opening portions 28b.

Thus, the melt conductor generated at melting of the interrupt wire 30 flows into the opening portion 28b. Accordingly, the melt conductor is less likely to stay, and the melt conductor at a high temperature is less likely to flow from the opening portion 28a and to influence other electronic components 22a. The above-described configuration of the opening portions 28b may be applied to other embodiments and modifications.

Figure 13A:
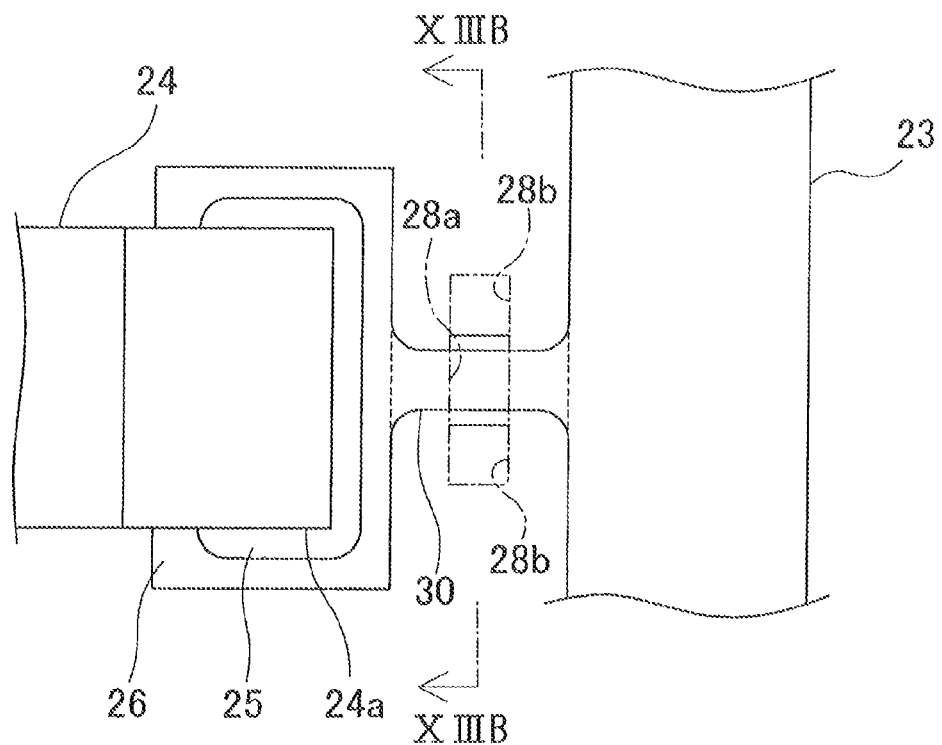
FIG. 13A is a diagram showing a part of a traction control device according to a first modification of the third embodiment and FIG. 13B is a cross-sectional view of the traction control device taken along line XIIIB-XIIIB in FIG. 13A.
Figure 13B:
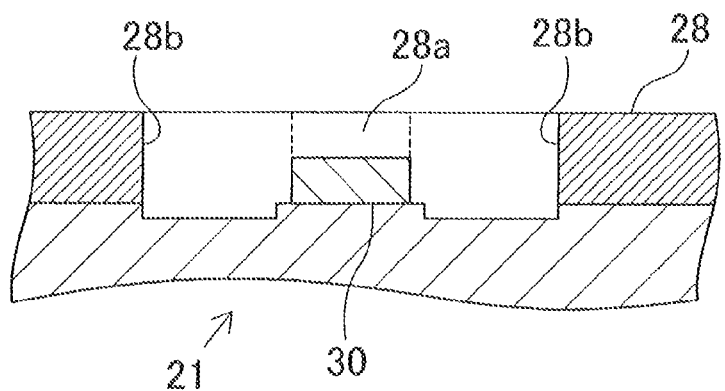

A traction control device 20b according to a first modification of the third embodiment will be described with reference to FIG. 13A and FIG. 13B. As shown in FIG. 13A and FIG. 13B, the opening portions 28b that are communicated with the opening portion 28a may be shaped deeper than the opening portion 28a. In this case, the stay of the melt conductor can be restricted and flow of the melt conductor from the opening portion 28b can be restricted.

Figure 14A:
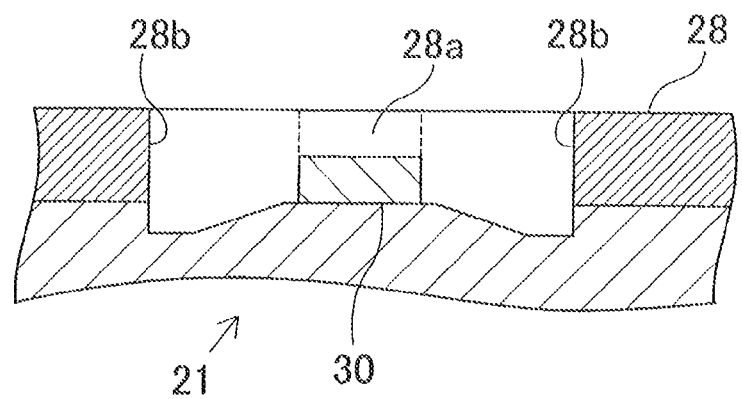
FIG. 14A to FIG. 14C are diagrams showing three different examples of a part of a traction control device according to a second modification of the third embodiment.
Figure 14B:
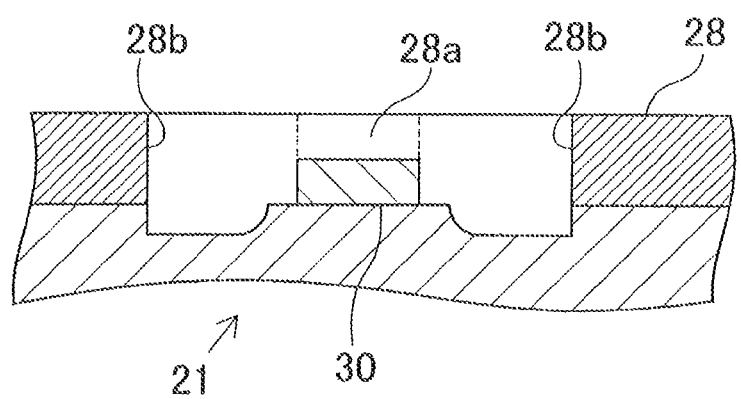
Figure 14C:
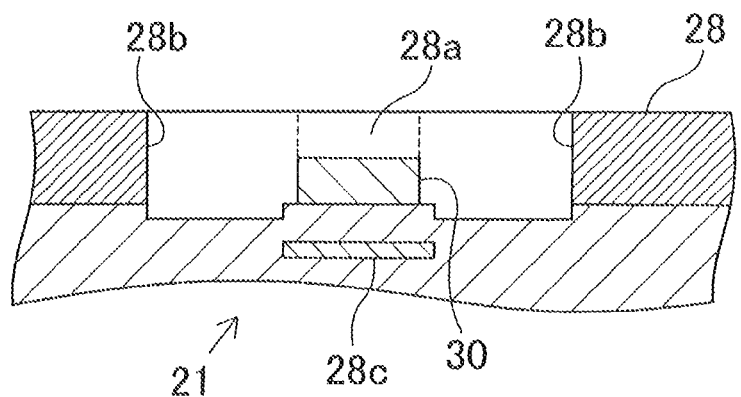

A traction control device 20b according to a second modification of the third embodiment will be described with reference to FIG. 14A to FIG. 14C. As shown in FIG. 14A, the opening portions 28b that are communicated with the opening portion 28a may have a taper-shaped bottom as viewed from the cross section. A depth of each opening portion 28b gradually increases in a direction from the opening portion 28a to each opening portion 28b. As shown in FIG. 14B, the opening portion 28b may also have a partially arc-shaped (R-shape) bottom as viewed from the cross section. A depth of each opening portion 28b gradually increases in a direction from the opening portion 28a to each opening portion 28b. By this configuration of the opening portions 28*b*, the stay of the melt conductor can be restricted and the melt conductor can easily flow from the opening portion 28*a* to the opening portions 28*b*. As shown in FIG. 14C, the opening portions 28*b* may also be shaped deeper than the opening portion 28*a* by disposing a core member 28*c* at an internal portion of the interrupt wire 30. By providing the core member 28*c* to elevate a position of the interrupt wire 30, a depth of the opening portion 28*a* becomes smaller than a depth of each opening portion 28*b*.

Figure 15A:
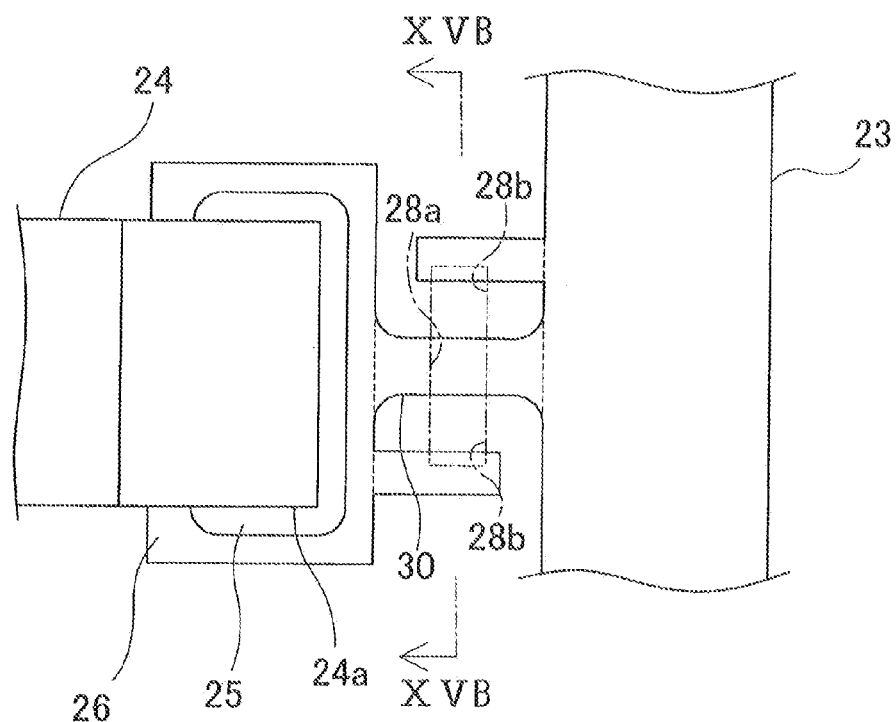
FIG. 15A is a diagram showing a part of a traction control device according to a third modification of the third embodiment and FIG. 15B is a cross-sectional view of the traction control device taken along line XVB-XVB in FIG. 15A.
Figure 15B:
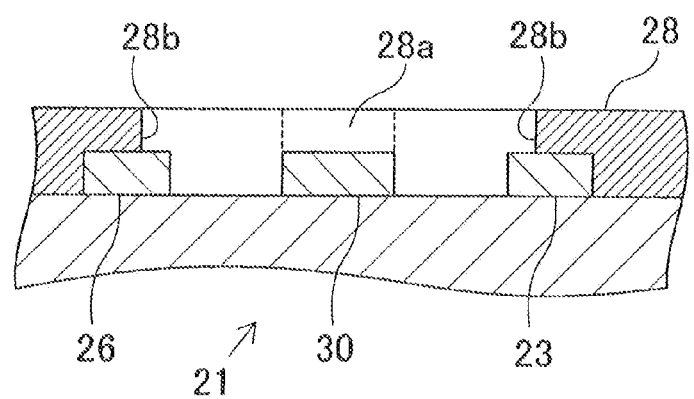

A traction control device 20*b* according to a third modification of the third embodiment will be described with reference to FIG. 15A and FIG. 15B. As shown in FIG. 15A and FIG. 15B, a portion of the power supply wire 23 and a portion of the land 26 may be exposed outside through the opening portions 28*b*. The exposed portions in the power supply wire 23 and the land 26 can work as an adherent member or an adsorption member to which the melt conductor generated by melting of the interrupt wire 30 adheres. When the melt conductor flows from the opening portion 28*a* to the opening portions 28*b*, the melt conductor adheres to the opening portions 28*b* by releasing heat at the exposed portions of the power supply wire 23 and the land 26. Thus, the stay of the melt conductor is restricted and flow of the melt conductor from the opening portions 28*b* can be restricted with certainty. Further, positions of the opening portions 28*b* defined by the solder resist layer 28 are not limited above the power supply wire 23 and the land 26 so that portions of the power supply wire 23 and the land 26 are exposed. The opening portion 28*b* may be defined by the solder resist layer 28 either above the power supply wire 23 or above the land 26. The opening portion 28*b* may also be defined by the solder resist layer 28 above another adherent member, such as another wire, to which the melt conductor adheres with releasing heat.

(Fourth Embodiment)

A traction control device 20*c* according to a fourth embodiment of the present disclosure will be described with reference to FIG. 16.

In the traction control device 20*c* according to the present embodiment, the interrupt wire 30 is coupled with the power supply wire 23 via a connection wire 40, and is coupled with the land 26 via another connection wire 50.

Figure 16:
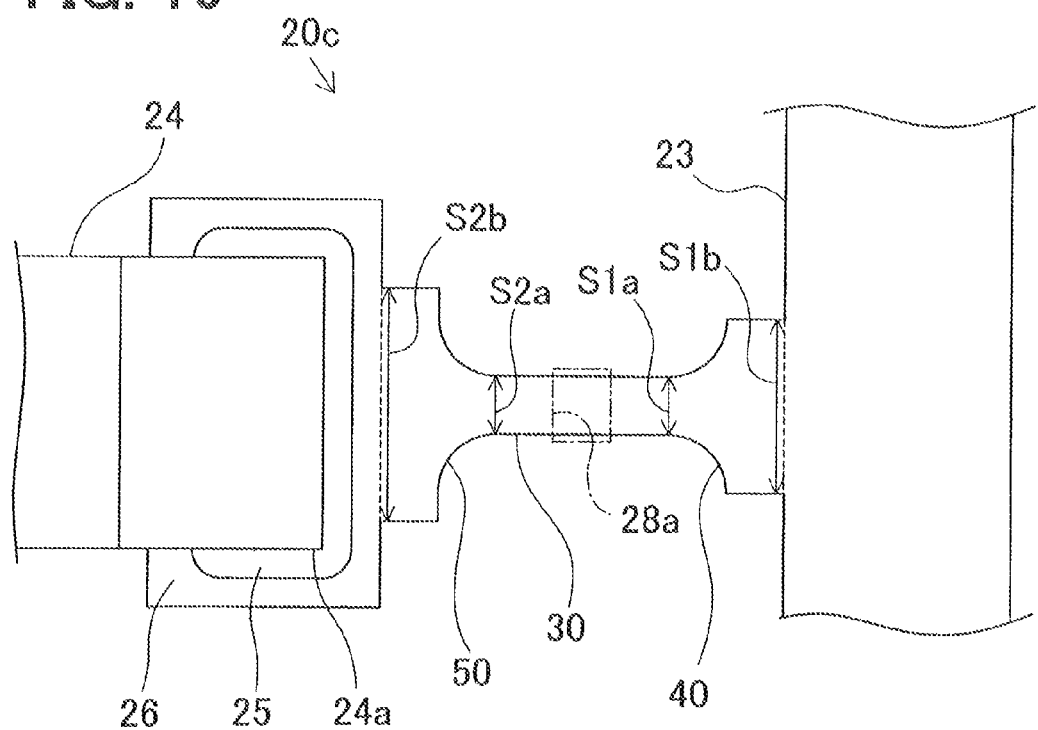
FIG. 16 is a diagram showing a part of a traction control device according to a fourth embodiment of the present disclosure.

As shown in FIG. 16, one end of the interrupt wire 30 is electrically coupled with the power supply wire 23 via the connection wire 40, and the other end of the interrupt wire 30 is electrically coupled with the land 26 via the connection wire 50. The connection wires 40 and 50 are made of conductive material, such as copper, in a manner similar to the interrupt wire 30 and the power supply wire 23. The connection wires 40 and 50 have a greater conductor volume than the interrupt wire 30.

As shown in FIG. 16, specifically, a wire width of the connection wire 40 increases toward the power supply wire 23 in an arc manner (R-shape) so that a cross-sectional area S1*a* at an end of the connection wire 40 adjacent to the interrupt wire 30 is smaller than a cross-sectional area S1*b* at the other end of the connection wire 40 adjacent to the power supply wire 23. Similarly, a wire width of the connection wire 50 increases toward the land 26 in an arc manner (R-shape) so that a cross-sectional area S2*a* at an end of the connection wire 50 adjacent to the interrupt wire 30 is smaller than a cross-sectional area S2*b* at the other end of the connection wire 50 adjacent to the land 26.

Thus, when heat generated at the interrupt wire 30 by an overcurrent is transmitted to the power supply wire 23 via the connection wire 40 and is transmitted to the land 26 via the connection wire 50, heat required for melting the interrupt wire 30 is not absorbed excessively to the power supply wire 23 and the land 26 compared with a case where heat is transmitted directly to the power supply wire 23 and the land 26. Accordingly, a variation in temperature rise in the interrupt wire 30 can be restricted, and the decrease in interrupt performance of the interrupt wire 30 can be restricted. In particular, the heat generated at the interrupt wire 30 by the overcurrent is gradually diffused in the connection wire 50 and is widely transmitted to the land 26. Thus, a local temperature rise in the land 26 can be restricted. Therefore, even when a solder having a relatively low melting point is used to the land 26, the solder is less likely to be melted by the heat from the interrupt wire 30. In addition, because the connection wires 40 and 50 have the greater conductor volume than the interrupt wire 30, the connection wires 40 and 50 can store heat from the interrupt wire 30.

Side ends of the connection wire 40 are smoothly connected with respective side ends of the interrupt wire 30 and the wire width of the connection wire 40 gradually increases toward the power supply wire 23. Because the side ends of the interrupt wire 30 and the respective side ends of the connection wire 40 are smoothly connected with each other, when the interrupt wire 30 and the connection wire 40 are formed using etching liquid, the etching liquid can uniformly flow at connecting portions of the side ends of the interrupt wire 30 and the respective side ends of the connection wire 40. Accordingly, the etching liquid is less likely to stay at the connecting portions and a variation in the wire width of the interrupt wire 30 can be restricted. Thus, the decrease in interrupt performance by the interrupt wire 30 can be restricted. The above-described configurations of the connection wires 40 and 50 coupled with respective ends of the interrupt wire 30 may be applied to other embodiments and modifications.

(Fifth Embodiment)

A traction control device 20*d* according to a fifth embodiment of the present disclosure will be described with reference to FIG. 17.

In the traction control device 20*d* according to the present embodiment, connection wires 40*a* and 50*a* are disposed in stead of the connection wires 40 and 50.

Figure 17:
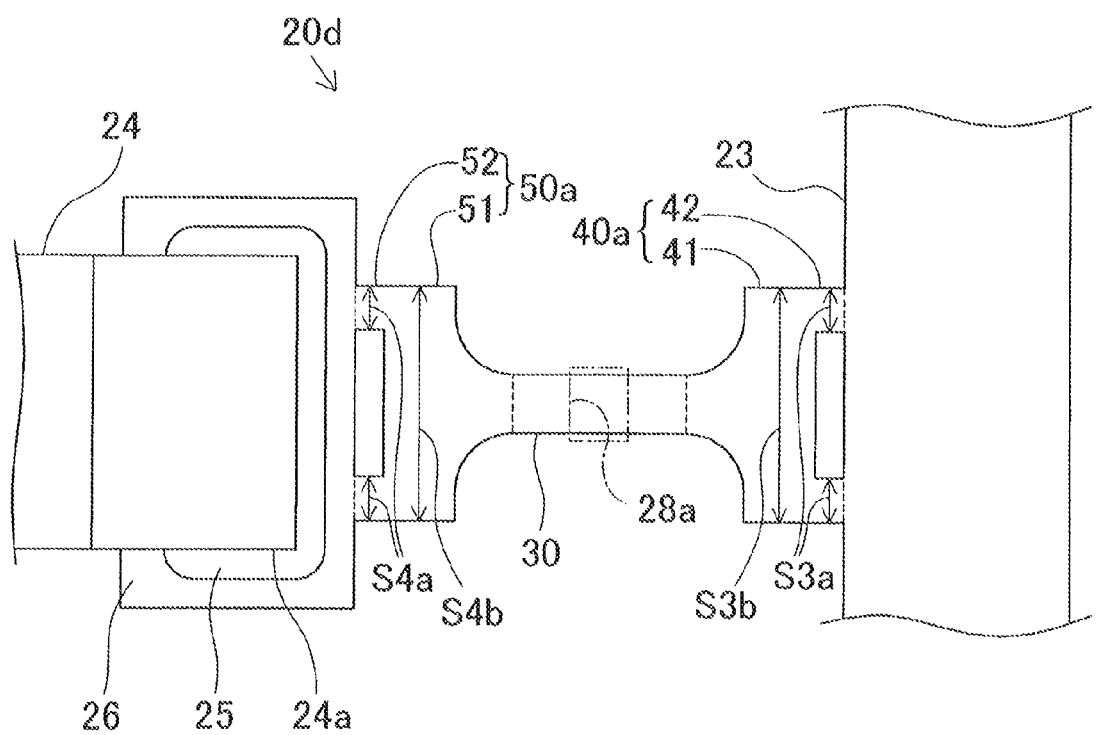
FIG. 17 is a diagram showing a part of a traction control device according to a fifth embodiment of the present disclosure.

As shown in FIG. 17, the connection wire 40*a* includes a heat storage portion 41 adjacent to the interrupt wire 30 and a narrow-down portion 42 adjacent to the power supply wire 23. The narrow-down portion 42 is designed so that a total cross-sectional area S3*a* of a connecting portion of the connection wire 40*a* with the power supply wire 23 is smaller than a cross-sectional area of a middle portion of the connection wire 40*a*, that is, a cross-sectional area S3*b* of the heat storage portion 41.

Similar to the connection wire 40*a*, the connection wire 50*a* includes a heat storage portion 51 adjacent to the interrupt wire 30 and a narrow-down portion 52 adjacent to the land 26. The narrow-down portion 52 is designed so that a total cross-sectional area S4*a* of a connecting portion of the connection wire 50*a* with the land 26 is smaller than a cross-sectional area of a middle portion of the connection wire 50*a*, that is, a cross-sectional area S4*b* of the heat storage portion 51.

Thus, heat transmitted to the connection wire 40*a* from the interrupt wire 30 is less likely to be transmitted to the power supply wire 23 via the narrow-down portion 42, and, the heat storage portion 41 stores heat. Because the heat storage portion 41 stores heat from the interrupt wire 30, when the interrupt wire 30 melts, a temperature of the heat storage portion 41 is relatively high. Thus, the variation in temperature rise in the interrupt wire 30 can be restricted, and the decrease in interrupt performance by the interrupt wire 30 can be restricted with certainty. The connection wire 50a that has a similar configuration with the connection wire 40a can also restrict the decrease in interrupt performance by the interrupt wire 30 with certainty.

By setting the interrupt wire 30 and the connection wires 40a and 50a to have a predetermined depth and to be made of a predetermined material, an interrupt condition is fixed so as to restrict the variation, and a pair of the interrupt wire 30 and the connection wire 40a and another pair of the interrupt wire 30 and the connection wire 50a can be widely used. In addition, because a heat storage amount of the connection wires 40a and 50a can be respectively controlled with a volume of the heat storage portion 41 and a volume of the heat storage portion 51, the melting time of the interrupt wire 30 can be easily controlled.

Because the connecting portion of the connection wire 40a with the power supply wire 23 is formed as the two narrow-down portions 42, when the heat from the interrupt wire 30 is transmitted to the power supply wire 23 via the two narrow-down portions 42, the heat is transmitted to the power supply wire 23 while being diffused in the narrow-down portions 42. Thus, a local temperature rise in the power supply wire 23 can be restricted. The connection wire 50a that has a similar configuration with the connection wire 40a can also restrict a local temperature rise in the land 26.

The number of the narrow-down portions 42 of the connection wire 40a may also be one or more than two depending on the interrupt condition. Similarly, the number of the narrow-down portions 52 of the connection wire 50a may also be one or more than two depending on the interrupt condition. The above-described configurations of the connection wires 40a and 50a coupled with each end of the interrupt wire 30 may be applied to other embodiments and modifications.

(Sixth Embodiment)

A traction control device 20e according to a sixth embodiment of the present disclosure will be described with reference to FIG. 18.

In the traction control device 20e according to the present embodiment, the power supply wire 23 is attached with a heat release portion 29a.

Figure 18:
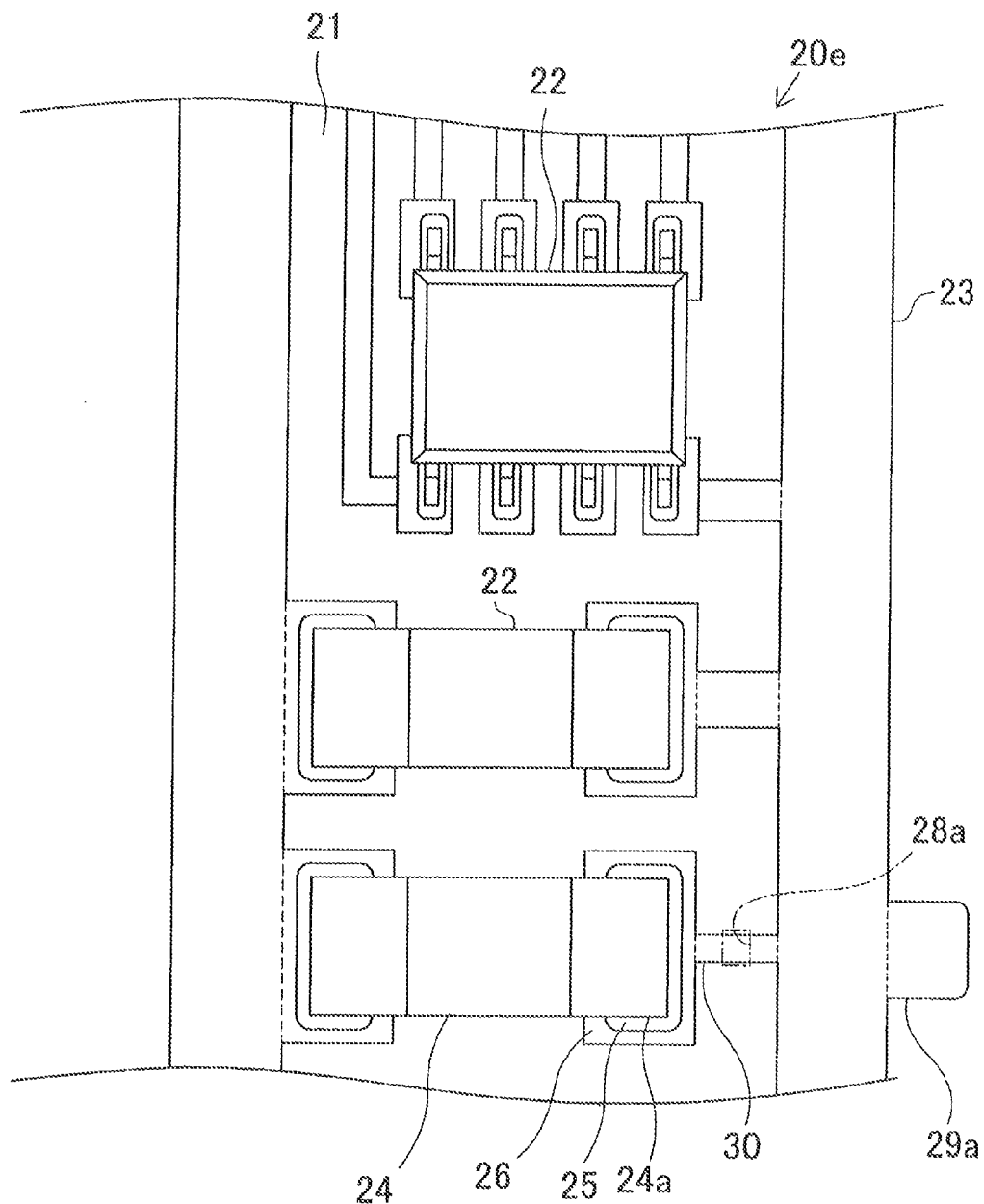
FIG. 18 is a diagram showing a part of a traction control device according to a sixth embodiment of the present disclosure.

As shown in FIG. 18, the heat release portion 29a is made of the same material as the power supply wire 23. A wiring distance between the interrupt wire 30 and the heat release portion 29a is shorter than wiring distances between the interrupt wire 30 and electronic components 22 except for the electronic component 22 coupled with the interrupt wire 30, that is, the ceramic capacitor 24 in the present embodiment.

Thus, when heat generated at the interrupt wire 30 by an overcurrent is transmitted to the power supply wire 23, the heat is transmitted to the heat release portion 29a and is released. Accordingly, the heat generated at the interrupt wire 30 is less likely to be transmitted to other electronic components 22 coupled with the power supply wire 23. The heat release portion 29a may be formed to have a wire shape, or the heat release portion 29a may be provided by a conductive portion formed in an interlayer connecting portion disposed in the circuit substrate 21. The above-described configuration of the heat release portion 29a may be applied to other embodiments and modifications.

Figure 19:
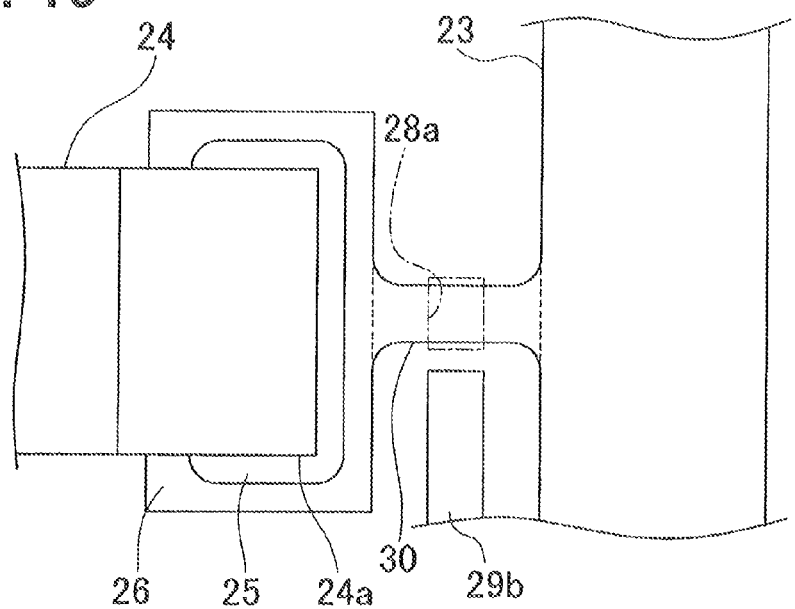
FIG. 19 is a diagram showing a part of a traction control device according to a modification of the sixth embodiment.

A traction control device 20e according to a modification of the sixth embodiment will be described with reference to FIG. 19. As shown in FIG. 19, as a heat release member, a heat release wire 29b for releasing heat generated at the interrupt wire 30 by an overcurrent may be disposed adjacent to the interrupt wire 30. The heat release wire 29b may be made of, for example, the same material of the power supply wire 23. Accordingly, the heat generated by the overcurrent is released by the heat release wire 29b, and the heat is less likely to be transmitted to other electronic components 22 to be protected against the heat. Thus, the decrease in interrupt performance by the interrupt wire 30 can be restricted, and normal operation of other electronic components 22 can be maintained. The decrease in interrupt performance means an increase in the melting time or in the interrupting current, or a variation in the melting time or in the interrupting current.

(Seventh Embodiment)

A traction control device 20f according to a seventh embodiment of the present disclosure will be described with reference to FIG. 20.

The traction control device 20f according to the present embodiment includes an interrupt wire 30b. In order to achieve a densely mounting, the power supply wire 23 is disposed between the lands 26 on which outside electrodes 24a of the ceramic capacitor 24 are mounted.

Figure 20:
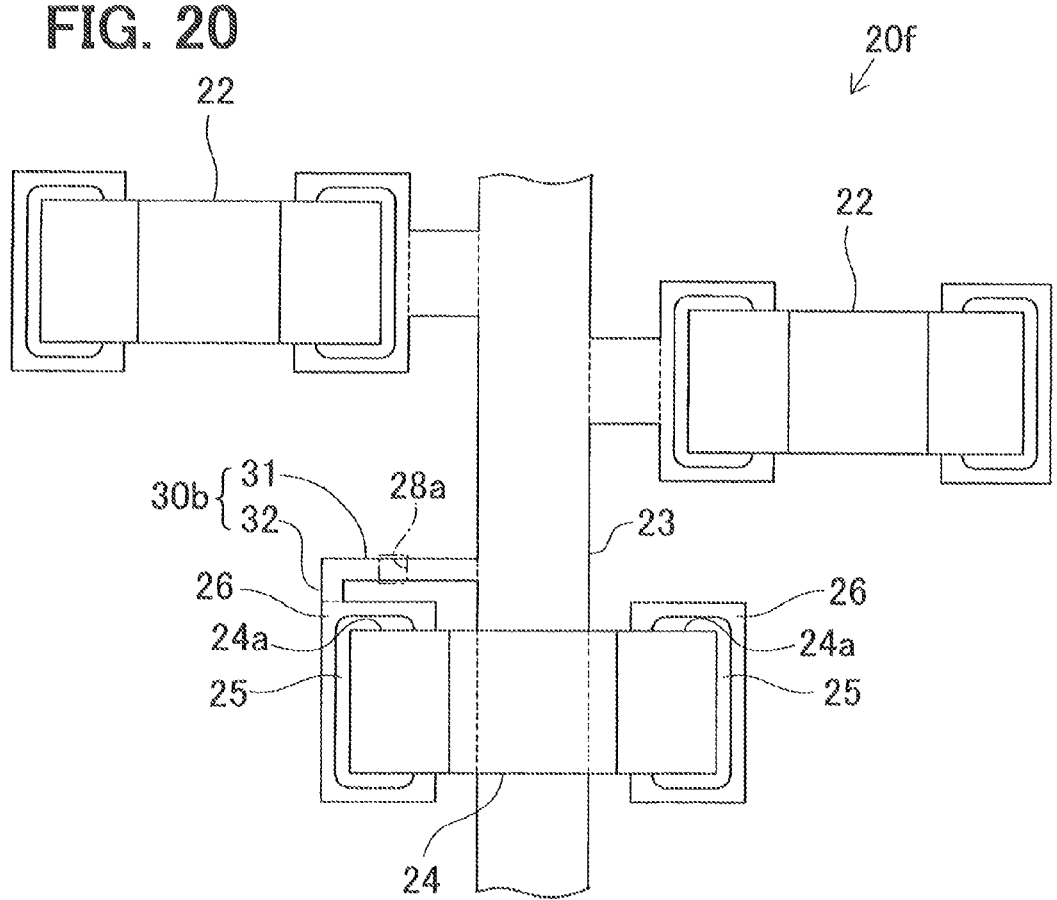
FIG. 20 is a diagram showing a part of a traction control device according to a seventh embodiment of the present disclosure.

As shown in FIG. 20, the interrupt wire 30b includes a first wire section 31 and a second wire section 32 that is shorter than the first wire section 31. The first wire section 31 and the second wire section 32 are coupled to each other at a predetermined angle. The predetermined angle is determined so that the first wire section 31 is coupled with the power supply wire 23 and the second wire section 32 is coupled with the land 26. For example, the predetermined angle is 90 degrees. The solder resist layer 28 defines the opening portion 28a in such a manner that a middle portion of an entire length of the interrupt wire 30b, which is most likely to generate heat, is exposed outside.

By bending the interrupt wire 30b at the predetermined angle, a wire length of the interrupt wire 30b can be increased compared with a case where the interrupt wire 30b has a straight shape while coupling the power supply wire 23 and the land 26. Accordingly, a required wire length of the interrupt wire 30b can be secured in a limited mounting area. Thus, the decrease in the interrupt performance by the interrupt wire 30b can be restricted and a size of the traction control device 20f can be decreased.

In the traction control device 20f according to the present embodiment, the first wire section 31 is coupled with the power supply wire 23, and the second wire section 32 is coupled with the land 26. Alternatively, the first wire section 31 may be coupled with the land 26, and the second wire section 32 may be coupled with the power supply wire 23. Further, a position of the predetermined angle at which the first wire section 31 and the second wire section 32 are coupled to each other may be set according to positions of the power supply wire 23 and the land 26. The interrupt wire 30b may be coupled with the power supply wire 23 via the connection wire 40, and may be coupled with the land 26 via the connection wire 50. The above-described configurations of the interrupt wire 30b may be applied to other embodiments and modifications.

(Eighth Embodiment)

A traction control device 220 according to an eighth embodiment of the present disclosure will be described with reference to FIG. 21 to FIG. 25.

In the traction control device 220 according to the present embodiment, a plurality of electronic components 222 for restricting an acceleration slip is densely-mounted on a circuit substrate 221. The circuit substrate 221 is electrically coupled with an external device and other electronic control devices 12 via, for example, a connector, and restricts an acceleration slip of the driving wheel based on a predetermined signal.

Each of the electronic components 222 on the circuit substrate 221 is electrically coupled with a power supply wire 223. The power supply wire 223 is coupled with the battery 13 by the power supply path via the fuse 14a and supplies electric power from the battery 13 to each of the electronic components 222, Thus, the power supply wire 223 is an example of a common wire shared by the electronic components 222.

Figure 21:
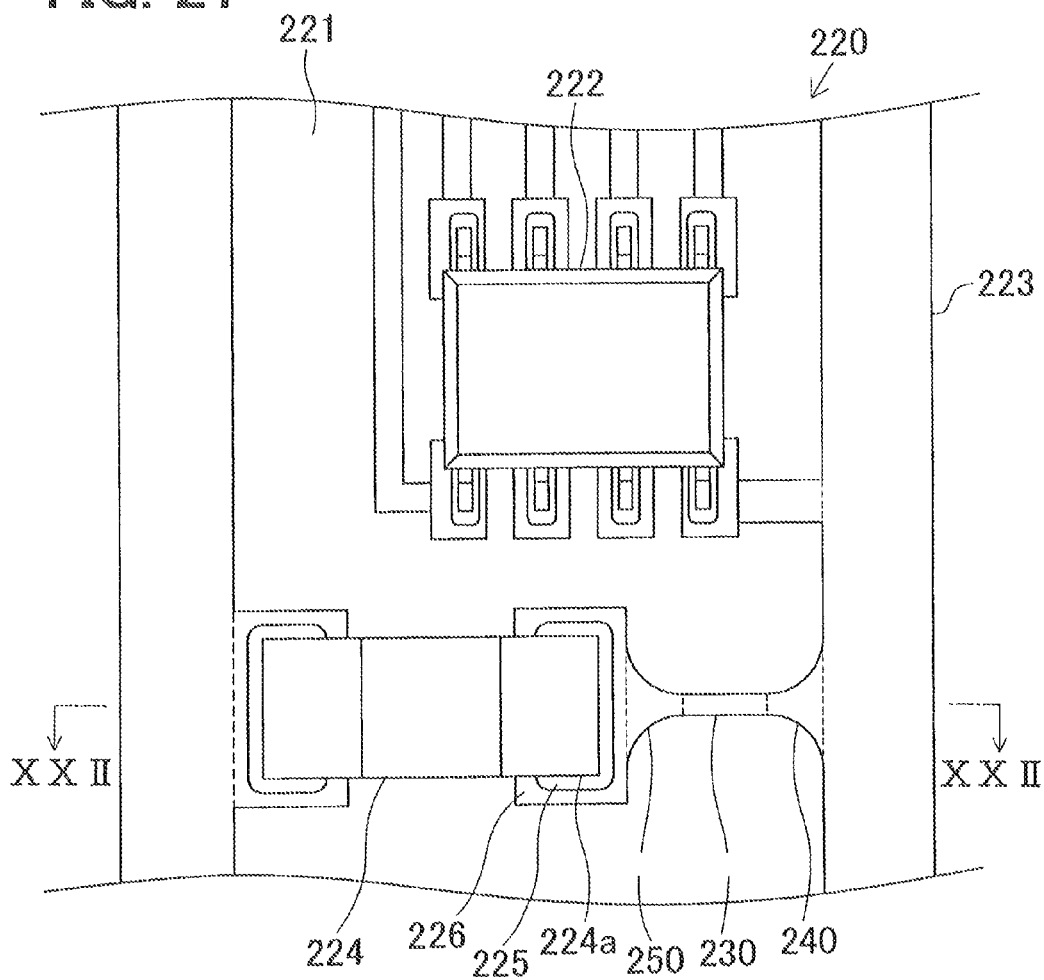
FIG. 21 is a diagram showing a part of a traction control device according to an eighth embodiment of the present disclosure.
Figure 22:
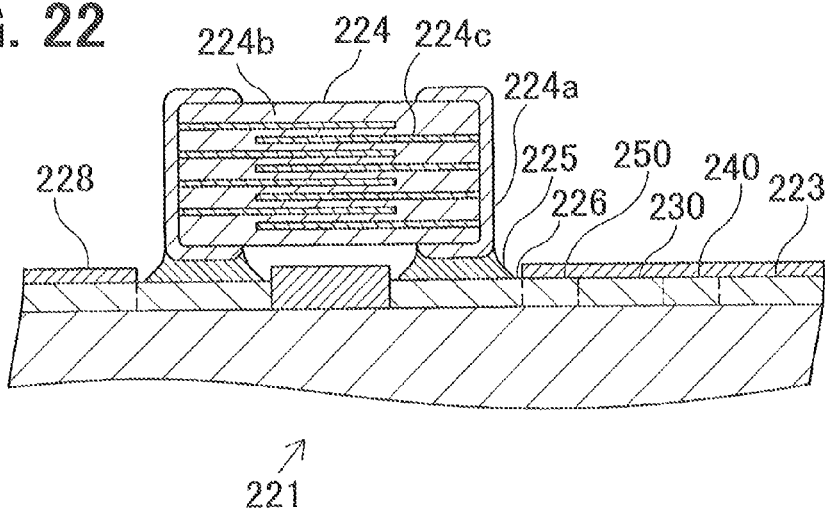
FIG. 22 is a cross-sectional view of the traction control device taken along line XXII-XXII in FIG. 21.

As shown in FIG. 21 and FIG. 22, one of the electronic components 222 on the circuit substrate 221 is a ceramic capacitor 224. The ceramic capacitor 224 may be formed by stacking a high-permittivity ceramic 224b made of barium titanate and an internal electrode 224c in layers for improving temperature characteristics and frequency characteristics, and thereby having a large capacity with a small size.

The ceramic capacitor 224 has outside electrodes 224a on either ends thereof. The outside electrodes 224a are mounted on respective lands 226 via solders 225. An interrupt wire 230 is disposed between one of the lands 226 and the power supply wire 223. The interrupt wire 230 melts by heat generated by an overcurrent and interrupts the electric coupling between the land 226 and the power supply wire 223 via the interrupt wire 230. Thus, the interrupt wire 230 can achieve an overcurrent protection depending on the circuit substrate 221.

The interrupt wire 230 has a wire width sufficiently smaller than a wire width of the power supply wire 223. The wire width means a dimension in a direction that is perpendicular to a direction of electric current on a surface of the circuit substrate 221. For example, the interrupt wire 230 has a wire width within a range from 0.2 mm to 0.3 mm, and the power supply wire 223 has a wire width of 2 mm.

One end of the interrupt wire 230 is electrically coupled with the power supply wire 223 via a connection wire 240, and the other end of the interrupt wire 230 is electrically coupled with the land 226 via another connection wire 250. The connection wires 240 and 250 are made of conductive material, such as copper, in a manner similar to the interrupt wire 230 and the power supply wire 223. The connection wires 240 and 250 have a greater conductor volume than the interrupt wire 230.

Figure 23:
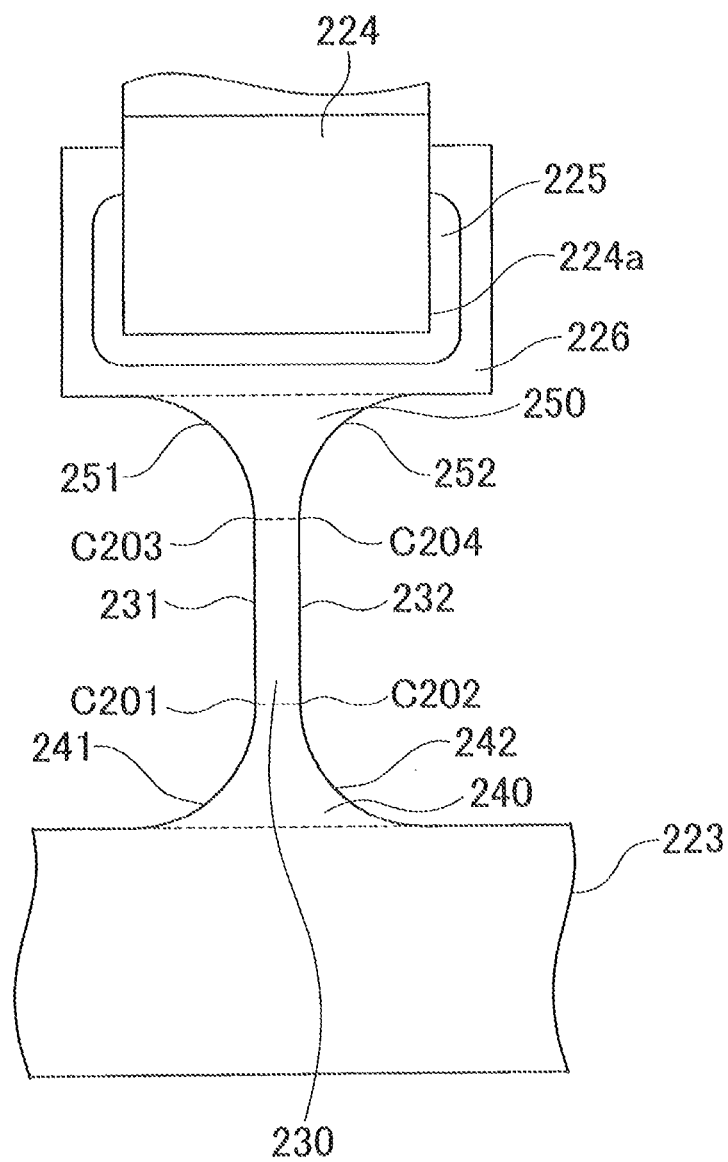
FIG. 23 is an enlarged view of a portion around an interrupt wire of the traction control device shown in FIG. 21.

As shown in FIG. 23, side ends 241 and 242 of the connection wire 240 are smoothly connected with respective side ends 231 and 232 of the interrupt wire 230. Specifically, a wire width of the connection wire 240 gradually increases toward the power supply wire 223 in an arc manner. That is, a cross-sectional of the connection wire 240 gradually increases toward the power supply wire 223 so that a cross-sectional area at an end of the connection wire 240 adjacent to the interrupt wire 230 is smaller than a cross-sectional area at the other end of the connection wire 240 adjacent to the power supply wire 223.

Additionally, side ends 251 and 252 of the connection wire 250 are smoothly connected with the respective side ends 231 and 232 of the interrupt wire 230. Specifically, a wire width of the connection wire 250 gradually increases toward the land 226 in an arc manner. That is, a cross-sectional of the connection wire 250 gradually increases toward the land 226 so that a cross-sectional area at an end of the connection wire 250 adjacent to the interrupt wire 230 is smaller than a cross-sectional area at the other end of the connection wire 250 adjacent to the land 226.

Figure 24:
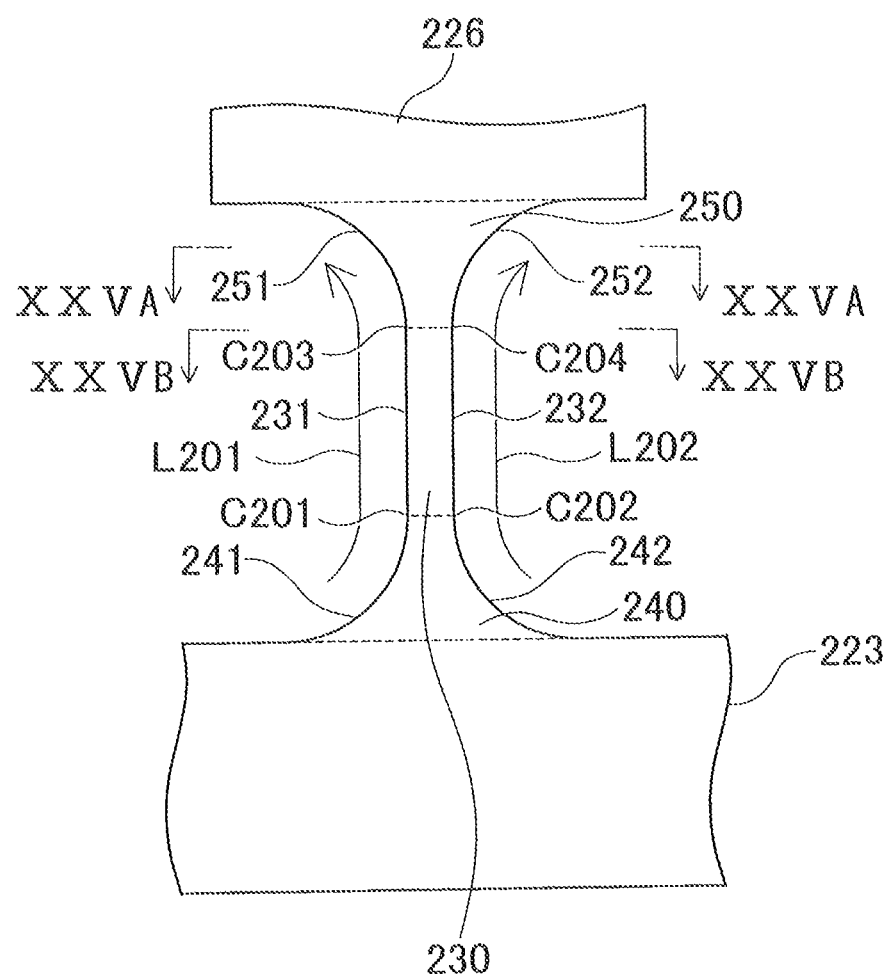
FIG. 24 is a diagram for describing a shape formation of an interrupt wire and a connection wire.

On the circuit substrate 221, a predetermined pattern for a wire section including the interrupt wire 230 and the connection wires 240 and 250 are formed as described below. FIG. 24 is a diagram for describing a shape formation of the interrupt wire 230 and the connection wires 240 and 250.

On the circuit substrate 221, a conductive layer made of conductive material, such as copper, is disposed to form the predetermined pattern for the wire section including the interrupt wire 230 and the connection wires 240 and 250. On the conductive layer, an etching resist layer is formed. Then, exposure and developing is performed so that a part of the etching resist layer is removed. The removed part of the etching resist layer corresponds to the conductive layer except a portion for the predetermined pattern of the wire section. Then the circuit substrate 221 is dipped into an etching liquid in order to remove the exposed portion of the conductive layer by etching. During the etching, on the conductive layer, the portion of the predetermined pattern for the wire section is covered with the etching resist layer.

Figure 25A:
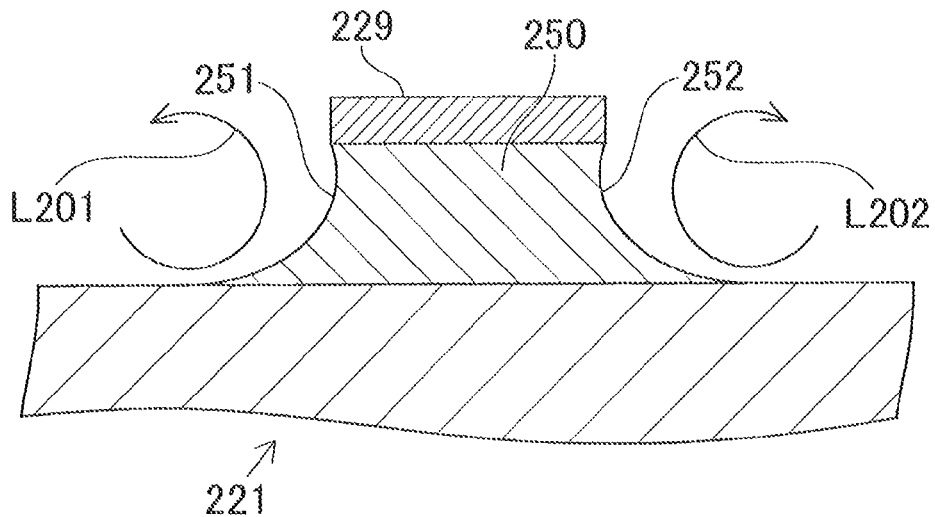
FIG. 25A is a cross-sectional view of the interrupt wire and the connection wire taken along line XXVA-XXVA in FIG. 24
Figure 25B:
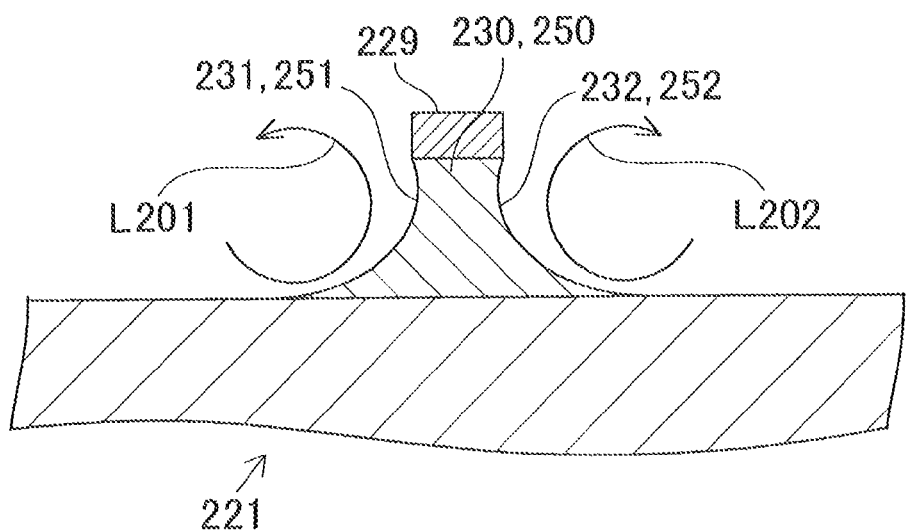
FIG. 25B is a cross-sectional view of the interrupt wire and the connection wire taken along line XXVB-XXVB in FIG. 24.

As shown in FIG. 24, FIG. 25A and FIG. 25B, in the conductive layer, etching liquid flows in directions shown by arrows L201 and L202 at the portions of the predetermined pattern for the wire section including the interrupt wire 230 and the connection wires 240 and 250. Then, the etching resist layer 229 shown in FIG. 25A and FIG. 25B is removed so that the predetermined pattern for the wire section including the interrupt wire 230 and the connection wires 240 and 250 is formed on the circuit substrate 221.

The predetermined pattern for the wire section is shaped in such a manner that the side ends 241 and 242 of the connection wire 240 are smoothly connected with the respective side ends 231 and 232 of the interrupt wire 230, and the side ends 251 and 252 of the connection wire 250 are smoothly connected with the respective side ends 231 and 232 of the interrupt wire 230. Thus, the etching liquid flows uniformly with ease at a connecting portion C201 between the side end 231 of the interrupt wire 230 and the side end 241 of the connection wire 240. Similarly, the etching liquid flows uniformly with ease at a connecting portion C202 between the side end 232 of the interrupt wire 230 and the side end 242 of the connection wire 240. Similarly, the etching liquid flows uniformly with ease at a connecting portion C203 between the side end 231 of the interrupt wire 230 and the side end 251 of the connection wire 250. Similarly, the etching liquid flows uniformly with ease at a connecting portion C204 between the side end 232 of the interrupt wire 230 and the side end 252 of the connection wire 250. Therefore, the stay of the etching liquid at the connecting portions C201 to C204 is restricted, and a variation in the wire width of the interrupt wire 230 at the connecting portions C201 to C204 is restricted.

In the traction control device 220 having the above-described configuration, for example, when a short-circuit fault occurs in the ceramic capacitor 224 and an overcurrent flows in the interrupt wire 230, the interrupt wire 230 generates heat in accordance with the overcurrent. When the generated heat becomes greater than a predetermined temperature, the interrupt wire 230 melts, and the electric coupling via the interrupt wire 230 is interrupted. Accordingly, the other electronic components 222 coupled with the power supply wire 223 can be protected against the overcurrent. The current at interruption is not high enough to blow the fuse 14a. Thus, the damage of the traction control device 220 does not influence to the other electronic control devices 12 supplied with power via the fuse 14a. A time from generation of the overcurrent to the melting of the interrupt wire 230 is a few milliseconds, and a melting time of each of the fuses 14a, 14b is generally about 0.02 seconds. Thus, the overcurrent protection can be appropriately achieved even to an electronic control device or an electronic component that is required to improve a processing speed.

Thus, heat generated at the interrupt wire 230 by an overcurrent is transmitted to the power supply wire 223 via the connection wire 240. When the interrupt wire 230 having a small wire width is directly coupled to the power supply wire 223 having a large wire width, the heat is easily transmitted to the power supply wire 223. Thus, the temperature of the interrupt wire 230 decreases, and the temperature decrease has a variation. Similarly, when the interrupt wire 230 is directly coupled to the land 226, the temperature of the interrupt wire 230 decreases, and the temperature decrease has a variation. Further, since the heat transmitted from the interrupt wire 230 is concentrated at a connecting portion between the interrupt wire 230 and the land 226, the solder 225 adjacent to the interrupt wire 230 melts and the melt conductor scatters to the around in some cases.

In the traction control device 220 according to the present embodiment, the heat generated at the interrupt wire 230 transmits to the power supply wire 223 via the connection wire 240, which has the smaller cross-sectional area at the portion connected with the interrupt wire 230 compared with the cross-sectional area at the portion connected with the power supply wire 223. Additionally, the heat generated at the interrupt wire 230 transmits to the land 226 via the connection wire 250, which has the smaller cross-sectional area at the portion connected with the interrupt wire 230 compared with the cross-sectional area at the portion connected with the land 226. Thus, the heat generated at the interrupt wire 230 stays at the connection wires 240 and 250, and transmission of the heat to the power supply wire 223 and the land 226 is restricted. By this configuration, a variation in the heat generated at the interrupt wire 230 is restricted, and therefore, a variation in the melting time is restricted even when the melting time is short. In addition, because the connection wires 240 and 250 have the greater conductor volume than the interrupt wire 230, the connection wires 240 and 250 can store heat from the interrupt wire 230.

As described above, in the traction control device 220 according to the present embodiment, the interrupt wire 230 is coupled with the power supply wire 223 via the connection wire 240, and is coupled with the land 226 via the connection wire 250. Additionally, the side ends 241 and 242 of the connection wire 240 are smoothly connected with the respective side ends 231 and 232 of the interrupt wire 230, and the wire width of the connection wire 240 gradually increases toward the power supply wire 223 in an arc manner. Additionally, the side ends 251 and 252 of the connection wire 250 are smoothly connected with the respective side ends 231 and 232 of the interrupt wire 230, and the wire width of the connection wire 250 gradually increases toward the land 226 in an arc manner.

As described above, because the interrupt wire 230 are smoothly connected with the connection wires 240 and 250, the etching liquid flows uniformly with ease at the connecting portion C201 between the side end 231 and the side end 241, the connecting portion C202 between the side end 232 and the side end 242, the connecting portion C203 between the side end 231 and the side end 251, and the connecting portion C204 between the side end 232 and the side end 252. Thus, the stay of the etching liquid at the connecting portions C201 to C204 is restricted and the variation in the wire width of the interrupt wire 230 is restricted. Further, the decrease in the interrupt performance of the interrupt wire 230 is restricted.

The power supply wire 223 is coupled with the battery 13, which supplies power not only to the traction control device 220 but also to other electronic control devices 12, by the power supply path, and the fuse 14a for protecting the traction control device 220 and other electronic control devices 12 is disposed on the power supply path. Even when a short-circuit fault occurs in the traction control device 220 including the interrupt wire 230, the interrupt wire 230 melts. Thus, influence of the short-circuit fault on the power supply to other electronic control devices can be restricted.

Figure 26:
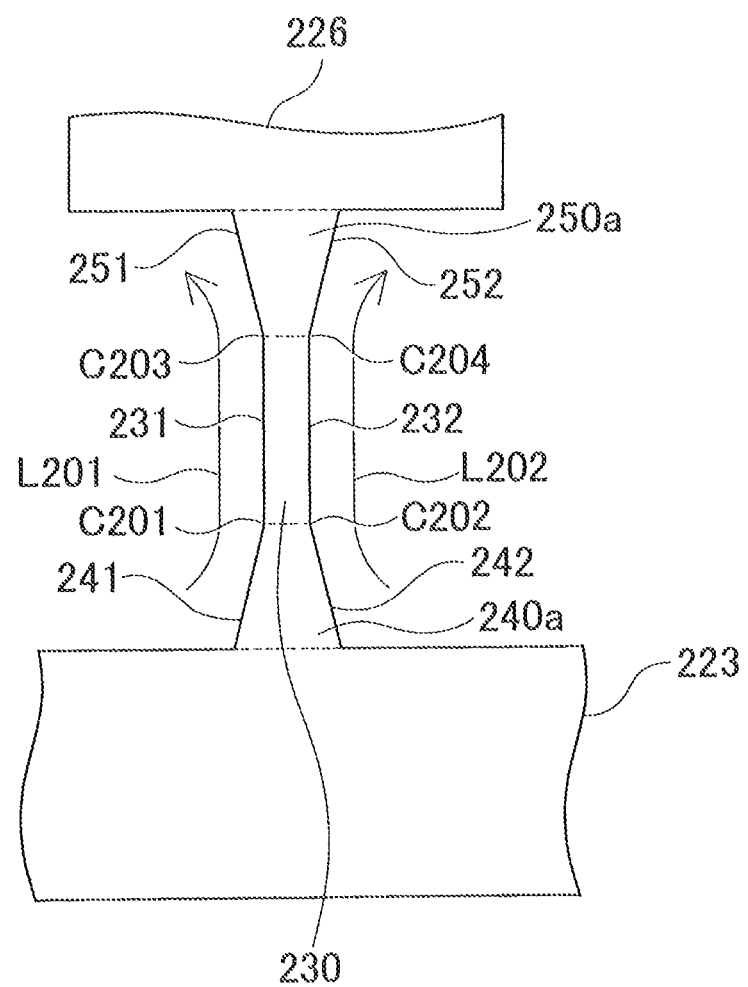
FIG. 26 is a diagram showing a part of a traction control device according to a first modification of the eighth embodiment.

A traction control device 220 according to a first modification of the eighth embodiment will be described with reference to FIG. 26. As shown in FIG. 26, the traction control device 220 may include connection wires 240a and 250a.

Specifically, side ends 241 and 242 of the connection wire 240a are smoothly connected with respective side ends 231 and 232 of the interrupt wire 230. A wire width of the connection wire 240a gradually increases toward the power supply wire 223 in a tapered shape. Additionally, side ends 251 and 252 of the connection wire 250a are smoothly connected with the respective side ends 231 and 232 of the interrupt wire 230. A wire width of the connection wire 250a gradually increases toward the land 226 in a tapered shape.

By the above-described configuration, the etching liquid flows uniformly with ease at a connecting portion C201 between the side end 231 and the side end 241, a connecting portion C202 between the side end 232 and the side end 242, a connecting portion C203 between the side end 231 and the side end 251, and a connecting portion C204 between the side end 232 and the side end 252. Thus, the stay of the etching liquid at the connecting portions C201 to C204 is restricted.

Figure 27:
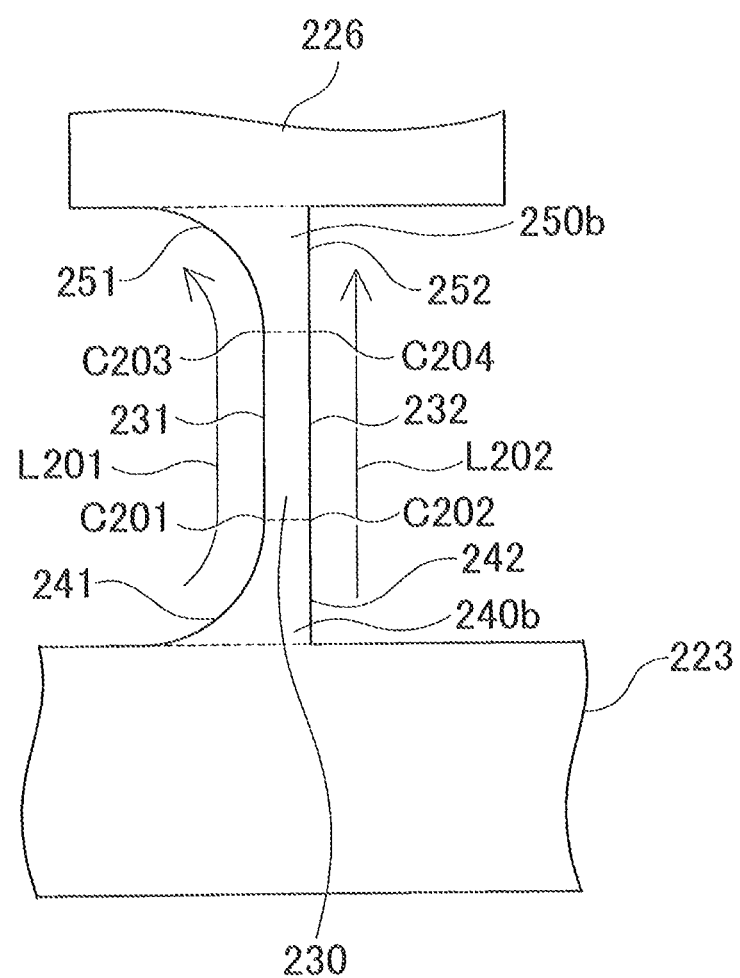
FIG. 27 is a diagram showing a part of a traction control device according to a second modification of the eighth embodiment.

A traction control device 220 according to a second modification of the eighth embodiment will be described with reference to FIG. 27. As shown in FIG. 27, the traction control device 220 may include connection wires 240b and 250b. Specifically, one side end 241 of the connection wire 240b is smoothly connected with corresponding side end 231 of the interrupt wire 230, and the other side end 242 of the connection wire 240b is linearly connected with corresponding side end 232 of the interrupt wire 230. Thus, a wire width of the connection wire 240b gradually increases toward the power supply wire 223. Additionally, one side end 251 of the connection wire 250b is smoothly connected with corresponding side end 231 of the interrupt wire 230, and the other side end 252 of the connection wire 250b is linearly connected with corresponding side end 232 of the interrupt wire 230. Thus, a wire width of the connection wire 250b gradually increases toward the land 226.

In the above-described configuration, because the etching liquid flows smoothly with ease at the side ends 242 and 252, the stay of the etching liquid is restricted with certainty. Further, because the side ends 241 and 251 are smoothly connected with the side end 231 of the interrupt wire 230, the stay of the etching liquid at the connecting portions C201 to C204 is restricted.

(Ninth Embodiment)

A traction control device 220a according to a ninth embodiment of the present disclosure will be described with reference to FIG. 28 and FIG. 29.

The traction control device 220a according to the present embodiment includes connection wires 240c and 250c. In addition to the connection wires 240c and 250c, the traction control device 220a also includes a pair of plate-like wires 260 and 270.

Figure 28:
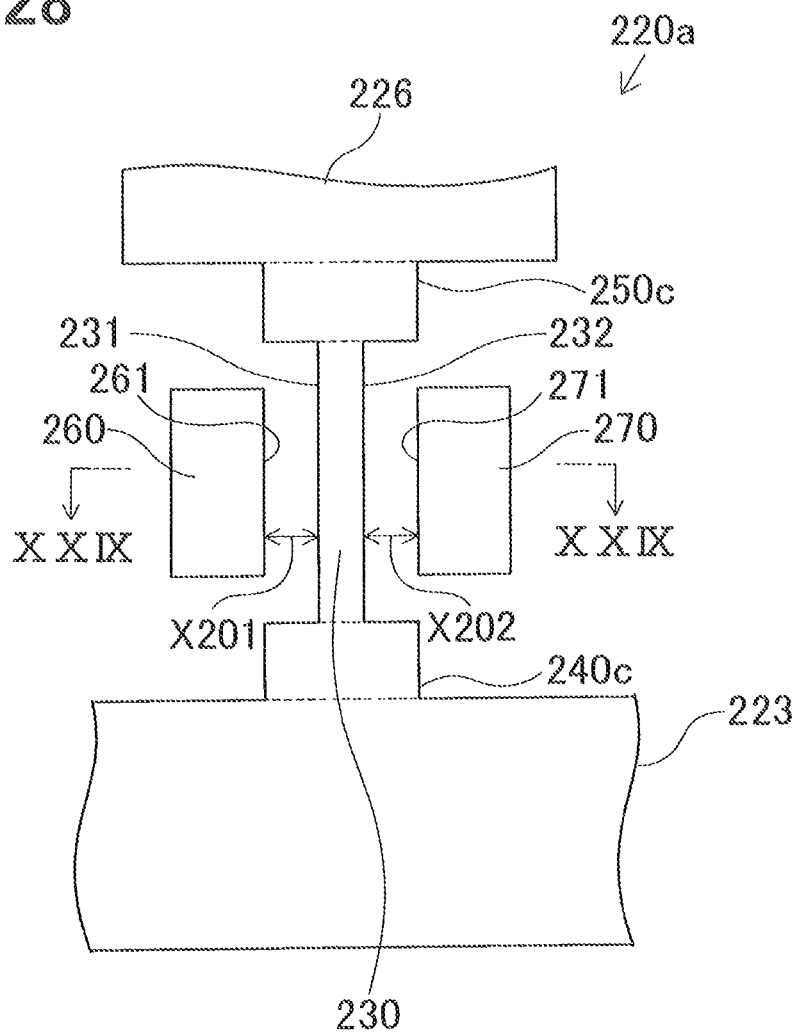
FIG. 28 is a diagram showing a part of a traction control device according to a ninth embodiment of the present disclosure.

As shown in FIG. 28, the connection wire 240c has a smaller cross-sectional area at a portion connected with the interrupt wire 230 compared with a cross-sectional area at a portion connected with the power supply wire 223. The connection wire 250c has a smaller cross-sectional area at a portion connected with the interrupt wire 230 compared with a cross-sectional area at a portion connected with the land 226.

A pair of plate-like wires 260 and 270 is disposed facing to each other on each side of the interrupt wire 230. The plate-like wires 260 and 270 are made of conductive material, such as copper, in a manner similar to the interrupt wire 230, and are not electrically coupled with other wires. The plate-like wire 260 can work as a first etching resist region and the plate-like wire 270 can work as a second etching resist region, that is, the pair of plate-like wires 260 and 270 is not etched by the etching liquid. Thus, the first etching resist region is disposed adjacent to a first side end of the interrupt wire, and the second etching resist region is disposed adjacent to a second side end of the interrupt wire.

The pair of plate-like wires 260 and 270, that is the pair of etching resist regions, is disposed in such a manner that a distance X201 from a side end 261 of the plate-like wire 260 and a first side end 231 of the interrupt wire 230 facing to the plate-like wire 260 is equal to a distance X202 between a side end 271 of the plate-like wire 270 and a second side end 232 of the interrupt wire 230 facing to the other plate-like wire 270 along the interrupt wire 230.

Figure 29:
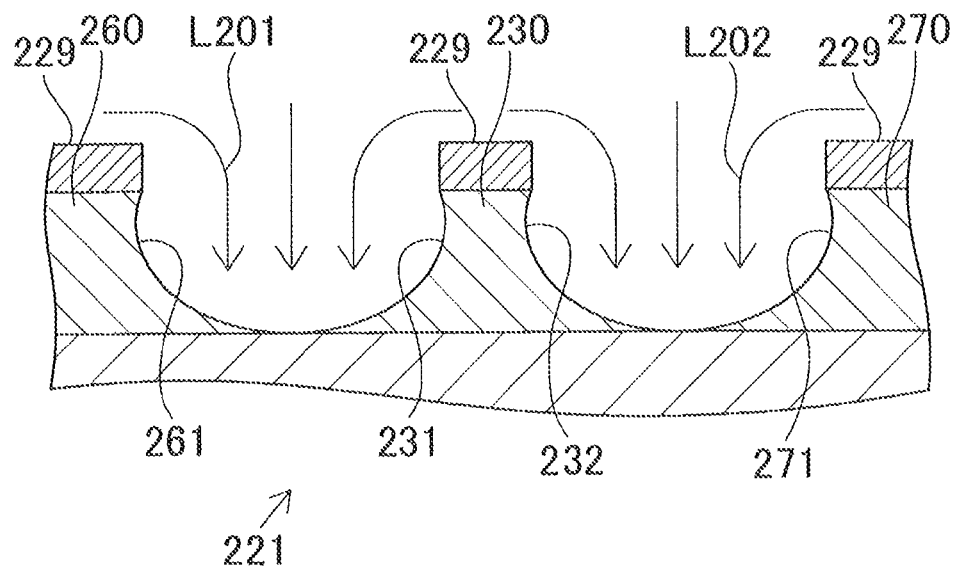
FIG. 29 is a cross-sectional view of the traction control device taken along line XXIX-XXIX in FIG. 28.

As shown in FIG. 29, in the above-described interrupt wire 230, when the circuit substrate 221 is dipped into the etching liquid, as shown by an arrow L201, the etching liquid flows into a space between the side end 261 of the plate-like wire 260 and the first side end 231 of the interrupt wire 230. As shown by an arrow L202, the etching liquid also flows into a space between the side end 271 of the plate-like wire 270 and the second side end 232 of the interrupt wire 230. Because the plate-like wires 260 and 270 are disposed in such a manner that the distance X201 and the distance X202 are approximately the same along the interrupt wire 230, a volume of etching liquid flow in the space between the side end 261 and the first side end 231 is approximately same with a volume of etching liquid flow in the space between the side end 271 and the second side end 232.

Since the volume difference between the etching liquid flows on each side end 231 and 232 of the interrupt wire 230 is small, a difference between etching speeds at the first side end 231 and at the second side end 232 of the interrupt wire 230 is small. Thus, a variation in a wire width of the interrupt wire 230 is restricted, and the decrease in the interrupt performance by the interrupt wire 230 can be restricted.

In the traction control device 220a according to the present embodiment, the plate-like wires 260 and 270 are disposed in such a manner that the distance X201 and the distance X202 are approximately the same along the interrupt wire 230. Alternatively, the plate-like wires 260 and 270 may also be disposed in such a manner that a distance difference between the distance X201 and the distance X202 is small. The plate-like wires 260 and 270 may also be made of a material that is not etched by the etching liquid except the conductive material.

Figure 30:
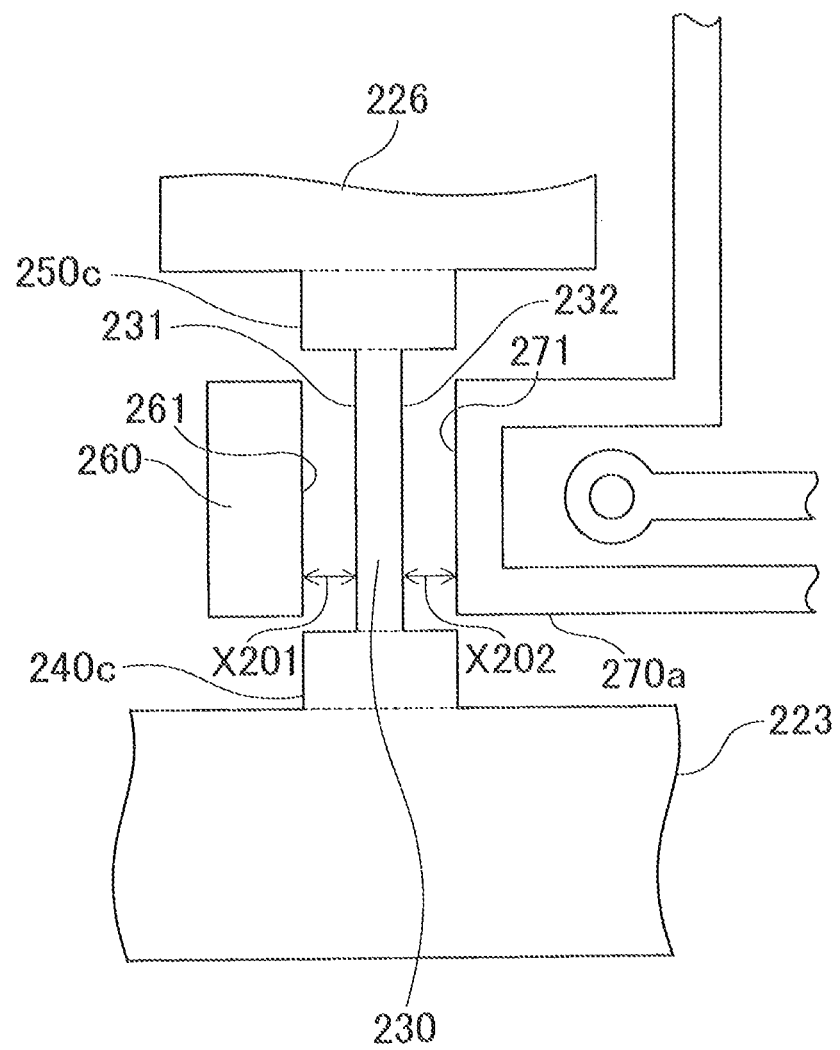
FIG. 30 is a diagram showing a part of a traction control device according to a first modification of the ninth embodiment.

A traction control device 220a according to a first modification of the ninth embodiment will be described with reference to FIG. 30. As shown in FIG. 30, at least one of the pair of plate-like wires 260 and 270 may be provided by a part of the wire section disposed on the circuit substrate 221.

For example, a portion 270a of the predetermined pattern for the wire section may be disposed adjacent to the second side end 232 of the interrupt wire 230 instead of disposing the plate-like wire 270. The portion 270a of the predetermined pattern for the wire section is electrically coupled to the electronic components 222. The plate-like wire 260 is disposed in such a manner that a distance X201 between a side end 261 of the plate-like wire 260 and the first side end 231 of the interrupt wire 230 is approximately the same with a distance X202 between a side end 271 of the portion 270a of the predetermined pattern for the wire section and the second side end 232 of the interrupt wire 230.

Since a difference in volumes of the etching liquid flow on each side end 231 and 232 of the interrupt wire 230 is small, a difference between etching speeds at each side end 231 and 232 of the interrupt wire 230 is small. Further, compared with disposing the pair of plate-like wires 260 and 270, disposing one plate-like wire 260 adjacent to the interrupt wire 230 can decrease a mounting area and can decrease a size of the circuit substrate 221 and a size of the traction control device 220a.

Figure 31:
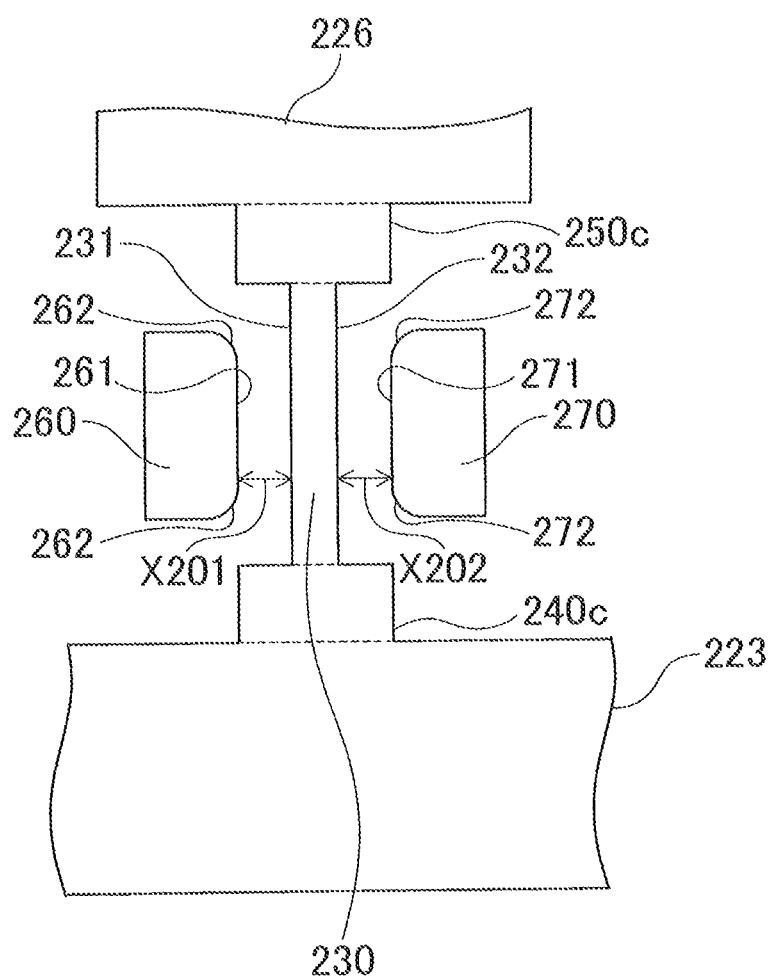
FIG. 31 is a diagram showing a part of a traction control device according to a second modification of the ninth embodiment.

A traction control device 220a according to a second modification of the ninth embodiment will be described with reference to FIG. 31. As shown in FIG. 31, corner portions 262 of the side end 261 of the plate-like wire 260 may be rounded. Additionally, corner portions 272 of the side end 271 of the plate-like wire 270 may be rounded. By rounding the corner portions 262 and 272, etching liquid flows easily in the spaces between the plate-like wires 260 and 270 and the interrupt wire. Thus, a difference between etching speeds at each side end 231 and 232 of the interrupt wire 230 is small, and thus, a variation in a wire width of the interrupt wire 230 can be restricted with certainty.

(Tenth Embodiment)

A traction control device 220b according to a tenth embodiment of the present disclosure will be described with reference to FIG. 32.

Compared with the traction control device 220 according to the eighth embodiment, the traction control device 220b according to the present embodiment includes a pair of plate-like wires 260 and 270, which are described in the ninth embodiment.

Figure 32:
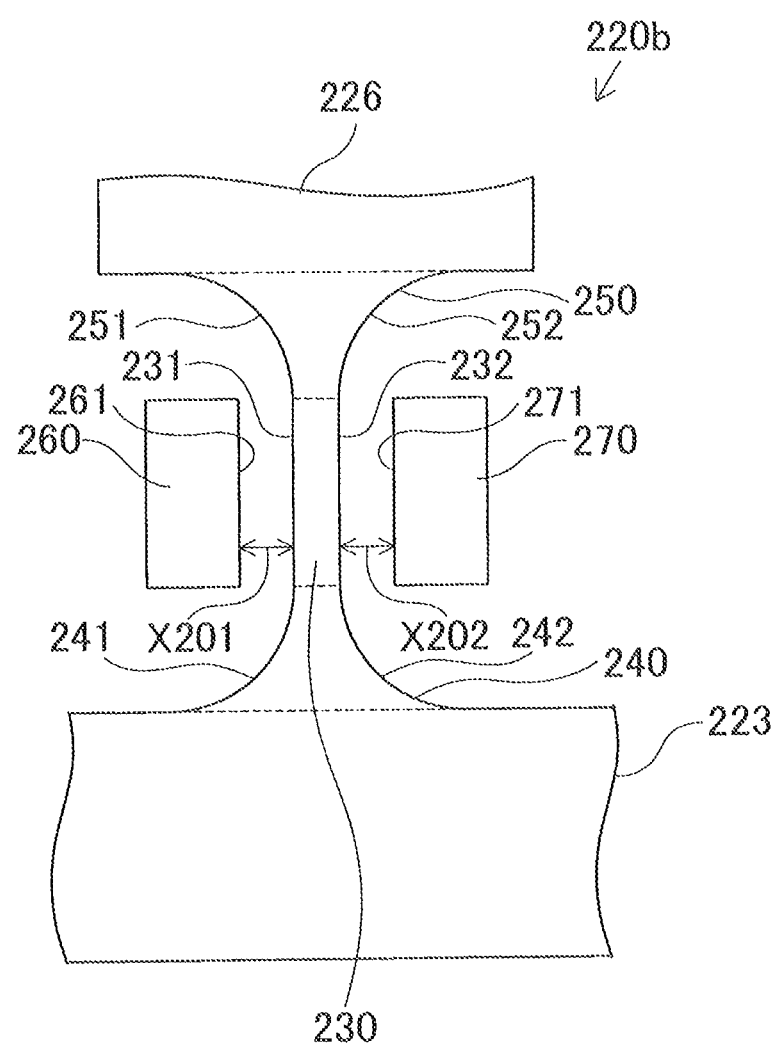
FIG. 32 is a diagram showing a part of a traction control device according to a tenth embodiment of the present disclosure.

As shown in FIG. 32, one end of the interrupt wire 230 is electrically coupled with the power supply wire 223 via the connection wire 240, and the other end of the interrupt wire 230 is electrically coupled with the land 226 via another connection wire 250. A pair of plate-like wires 260 and 270 is disposed facing to each other on each side of the interrupt wire 230. The pair of plate-like wires 260 and 270 is disposed in such a manner that a distance X201 from a side end 261 to a first side end 231 and a distance X202 from a side end 271 to a second side end 232 are approximately the same along the interrupt wire 230.

As described in the eighth embodiment, because the side ends of the interrupt wire 230 are smoothly connected with respective side ends of the connection wires 240 and 250, the etching liquid flows uniformly with ease at the connecting portion C201 between the first side end 231 and the side end 241, the connecting portion C202 between the second side end 232 and the side end 242, the connecting portion C203 between the first side end 231 and the side end 251, and the connecting portion C204 between the second side end 232 and the side end 252. Thus, the stay of the etching liquid at the connecting portions C201 to C204 is restricted and the variation in the wire width of the interrupt wire 230 is restricted. Further, disposing the pair of plate-like wires 260 and 270 can decrease the volume difference of the etching liquid flow on each side end 231 and 232 of the interrupt wire 230. Thus, a difference between etching speeds at each side end 231 and 232 of the interrupt wire 230 is small.

Accordingly, not only the connecting portions C201 to C204, but also the side ends 231 and 232 are etched uniformly. Thus, the variation in the wire width of the interrupt wire 230 is restricted and the decrease in the interrupt performance by the interrupt wire 230 can be restricted with certainty.

(Eleventh Embodiment)

A traction control device 320 according to an eleventh embodiment of the present disclosure will be described with reference to FIG. 33 and FIG. 34.

The traction control device 320 includes a plurality of electronic components 322 for restricting an acceleration slip is densely-mounted. The electronic components 322 are densely-mounted on a circuit substrate 321. The circuit substrate 321 is electrically coupled with an external device and other electronic control devices 12 via, for example, a connector, and restricts an acceleration slip of the driving wheel based on a predetermined signal.

Figure 33:
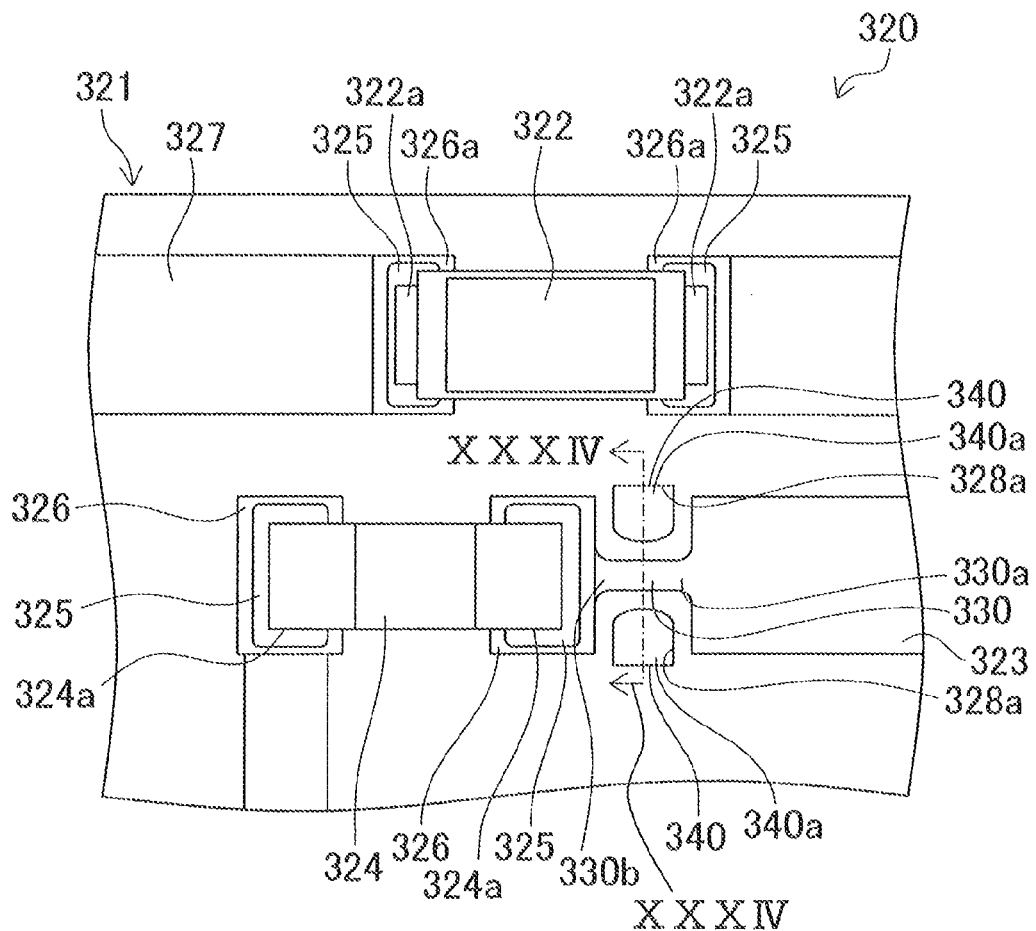
FIG. 33 is a diagram showing a part of a traction control device according to an eleventh embodiment of the present disclosure.

As shown in FIG. 33, on the circuit substrate 321, a plurality of electronic components including a ceramic capacitor 324 and the electronic component 322, which is to be protected, and a plurality of wires including the power supply wire 323 and a component-coupling wire 327 for coupling the electronic component 322 to the circuit are densely-mounted. The electronic component 322 is disposed adjacent to the ceramic capacitor 324. Various circuits are configured by coupling the electronic components with wires. Each of the electronic component 322 and circuits (not shown) on the circuit substrate 321 is electrically coupled with the power supply wire 323. The power supply wire 323 operates as a common wire shared by the electronic component 322 and the circuits. The power supply wire 323 supplies electric power from the battery 13 to each of the electronic component 322 and each of the circuits.

Figure 34:
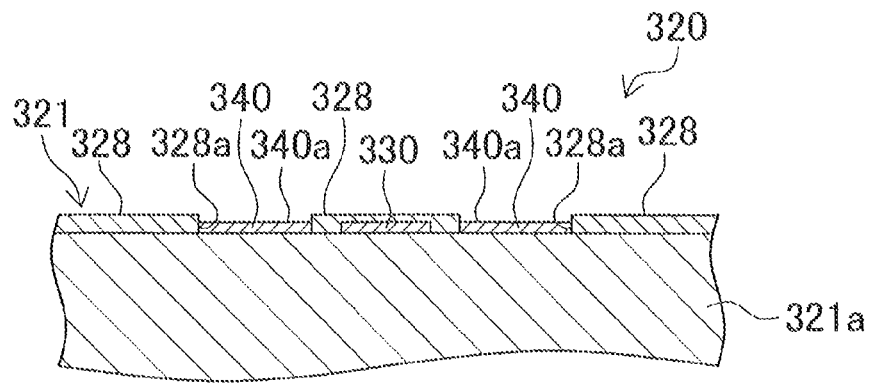
FIG. 34 is a cross-sectional view of the traction control device taken along line XXXIV-XXXIV in FIG. 33.

As shown in FIG. 34, the circuit substrate 321 includes a plurality of insulating layers 321a and a plurality of conductive layers that is stacked on the insulating layer 321a. The insulating layer 321a is made of a glass woven fabric that is treated with epoxy resin impregnant. The conductive layers operate as wires that configure the circuits and are made of conductive material, such as copper. The power supply wire 323 and a component-coupling wire 327 for the ceramic capacitor 324 are a part of the conductive layers. A surface of the circuit substrate 321 is covered with a solder resist layer 328, and the solder resist layer 328 can work as a protective layer, which protects the surface of the circuit substrate 321.

The ceramic capacitor 324 is surface-mounted on the circuit substrate 321. The ceramic capacitor 324 has outside electrodes 324a on either ends thereof. The outside electrodes 324a are mounted on respective lands 326 via solders 325. The lands 326 are provided by a part of the wires disposed on the circuit substrate 321. The ceramic capacitor 324 may be formed by stacking a high-permittivity ceramic made of barium titanate and an internal electrode in layers for improving temperature characteristics and frequency characteristics, and thereby having a large capacity with a small size. The electronic component 322 is mounted on lands 326a, which are coupled with the component-coupling wire 327, via solders 325 in a surface-mount manner.

An interrupt wire 330 is coupled between one of the lands 326 of the ceramic capacitor 324 and the power supply wire 323. The interrupt wire 330 melts by heat generated by an overcurrent and interrupts the electric coupling between the land 326 and the power supply wire 323 via the interrupt wire 330. Thus, the interrupt wire 330 can achieve an overcurrent protection depending on the circuit substrate 321.

The interrupt wire 330 has a wire width sufficiently smaller than a wire width of the power supply wire 323. The wire width means a dimension in a direction that is perpendicular to a direction of electric current on a surface of the circuit substrate 321. For example, the interrupt wire 330 has a wire width within a range from 0.2 mm to 0.3 mm, and the power supply wire 323 has a wire width of 2 mm.

The interrupt wire 330 is coupled with the power supply wire 323 via a connection wire 330a, and is coupled with the land 326 via another connection wire 330b. The connection wires 330a and 330b are made of conductive material, such as copper, in a manner similar to the interrupt wire 330 and the power supply wire 323. The connection wires 330a and 330b have a greater conductor volume than the interrupt wire 330.

Specifically, side ends of the connection wire 330a are smoothly connected with respective side ends of the interrupt wire 330. The wire width of the connection wire 330a gradually increases toward the power supply wire 323 in an arc manner on both sides. Additionally, side ends of the connection wire 330b are smoothly connected with respective side ends of the interrupt wire 330. The wire width of the connection wire 330b gradually increases toward the land 326 in an arc manner on both sides. Because, the wire width of the connection wire 330a gradually increases toward the power supply wire 323, a cross-sectional area at an end of the connection wire 330a adjacent to the interrupt wire 330 is smaller than a cross-sectional area at the other end of the connection wire 330a adjacent to the power supply wire 323.

A pair of adherent wires 340 may be disposed adjacent to the interrupt wire 330. The adherent wires 340 can work as an adherent member to which the melt conductor generated by melting of the interrupt wire 330 adheres. Compared with other electronic component 322, the adherent wires 340 are disposed adjacent to the interrupt wire 330. Additionally, the adherent wires 340 are disposed approximately at a center of the power supply wire 323 and the land 326. The pair of adherent wires 340 is disposed facing to each other on each side of the interrupt wire 330.

The adherent wires 340 are made of conductive material, such as copper, in a manner similar to the interrupt wire 330 and the power supply wire 323. The adherent wires 340 are disposed on a surface of the insulating layer 321a. In each adherent wire 340, a periphery portion facing to the interrupt wire 330 has a curved convex shape.

The solder resist layer 328 defines the opening portions 328a on each side of the interrupt wire 330 in such a manner that the opening portions 328a are defined above respective adherent wires 340 and have similar shapes with respective adherent wires 340. Thus, the adherent wires 340 are exposed outside through the opening portions 328a. The exposed surfaces of the adherent wires 340 are covered with solders 340a. The solder 340a may be made of a metal having a lower melting point than a melting point of the interrupt wire 330.

In the traction control device 320 having the above-described configuration, for example, when a short-circuit fault occurs in the ceramic capacitor 324 and an overcurrent flows in the interrupt wire 330, the interrupt wire 330 generates heat in accordance with the overcurrent. When the generated heat becomes greater than a predetermined temperature, the interrupt wire 330 melts, and the electric coupling via the interrupt wire 330 is interrupted. Accordingly, the other electronic component 322 coupled with the power supply wire 323 can be protected against the overcurrent. The current at interruption is not high enough to blow the fuse 14a. Thus, the damage of the traction control device 320 does not influence to the other electronic control devices 12 supplied with power via the fuse 14a. A time from generation of the overcurrent to the melting of the interrupt wire 330 is a few milliseconds, and a melting time of each of the fuses 14a, 14b is generally about 0.02 seconds. Thus, the overcurrent protection can be appropriately achieved even to an electronic control device or an electronic component that is required to improve a processing speed.

When overcurrent flows in the interrupt wire 330, the interrupt wire 330 generates heat in accordance with the overcurrent. When the generated heat becomes greater than a predetermined temperature, the interrupt wire 330 expands and bursts by the generated heat, and melts to the melt conductor. The melt conductor bursts out through the solder resist layer 328 and flows on a surface of the solder resist layer 328. When the melt conductor flows to the adherent wires 340, the melt conductor adheres to the adherent wires 340 adjacent to the interrupt wire 330, and the flow of the melt conductor is restricted.

Specifically, when the melt conductor flows to the adherent wires 340, the solders 340a that covers the surfaces of the adherent wires 340 melt by heat of the melt conductor. The melt solders 340a are mixed with the melt conductor so that the melt conductor is held by the adherent wires 340 and loses flowability by releasing heat and being hardened. Thus, the flow of the melt conductor is restricted by the adherent wires 340.

As described above, in the traction control device 320 according to the present embodiment, the adherent wires 340 are disposed on each side of the interrupt wire 330 facing to each other so that a path through which the melt conductor flows has a larger width. Thus, even when a flow direction of the melt conductor is difficult to be predicted, the melt conductor can adhere to the adherent wires 340 with certainty. Accordingly, when the melt conductor flows to a connecting portion of the electronic component 322 and the land 326a, and the component-coupling wire 327, a defect in coupling of the electronic component 322 and a short-circuit fault can be restricted. Thus, the electronic component 322 and the circuit are protected from the melt conductor without being affected adversely by the melt conductor.

The solder resist layer 328 defines the opening portions 328a so that the adherent wires 340 are exposed outside through the opening portions 328a. The adherent wires 340 are covered with the solders 340a. Thus, when the melt conductor flows on the adherent wires 340, the melt conductor adheres to the solders 340a with certainty.

The power supply wire 323 is coupled with the battery 13, which supplies power not only to the traction control device 320 but also to other electronic control devices 12, by the power supply path, and the fuse 14a for protecting the traction control device 320 and other electronic control devices 12 is disposed on the power supply path. Even when a short-circuit fault occurs in the traction control device 320 including the interrupt wire 330, the interrupt wire 330 melts. Thus, influence of the short-circuit fault on the power supply to other electronic control devices 12 can be restricted.

When heat generated at the interrupt wire 330 by an overcurrent is transmitted to the power supply wire 323 via the connection wire 330a and is transmitted to the land 326 via the connection wire 330b, heat required for melting the interrupt wire 330 is not absorbed excessively to the power supply wire 323 and the land 326 compared with a case where heat is transmitted directly to the power supply wire 323 and the land 326. Accordingly, a variation in temperature rise in the interrupt wire 330 can be restricted, and the decrease in interrupt performance of the interrupt wire 330 can be restricted. In particular, the heat generated at the interrupt wire 330 by the overcurrent is gradually diffused in the connection wire 330b and is widely transmitted to the land 326. Thus, a local temperature rise in the land 326 can be restricted. Therefore, the solder 325 is less likely to be melted by the heat from the interrupt wire 330. In addition, because the connection wires 330a and 330b have the greater conductor volume than the interrupt wire 330, the connection wires 330a and 330b can store heat from the interrupt wire 330.

Side ends of the connection wire 330a are smoothly connected with respective side ends of the interrupt wire 330. Additionally, side ends of the connection wire 330b are smoothly connected with respective side ends of the interrupt wire 330. When the interrupt wire 330 and the connection wires 330a and 330b are formed using etching liquid, the etching liquid can uniformly flow at connecting portions between side ends of the interrupt wire 330 and the side ends of the connection wire 330a, and connecting portions between side ends of the interrupt wire 330 and the side ends of the connection wire 330b Accordingly, the etching liquid is less likely to stay at the connecting portions and a variation in the wire width of the interrupt wire 330 can be restricted. Thus, the decrease in the interrupt performance by the interrupt wire 330 can be restricted.

In the traction control device 320 according to the present embodiment, the electronic component 322 and the component-coupling wire 327 are described as an example of electronic components to be protected from the melt conductor and wires to be protected from the melt conductor. However, it is obvious that the electronic components and circuits mounted on the circuit substrate 321 except the ceramic capacitor 324 needs to be protected from the melt conductor.

Figure 35:
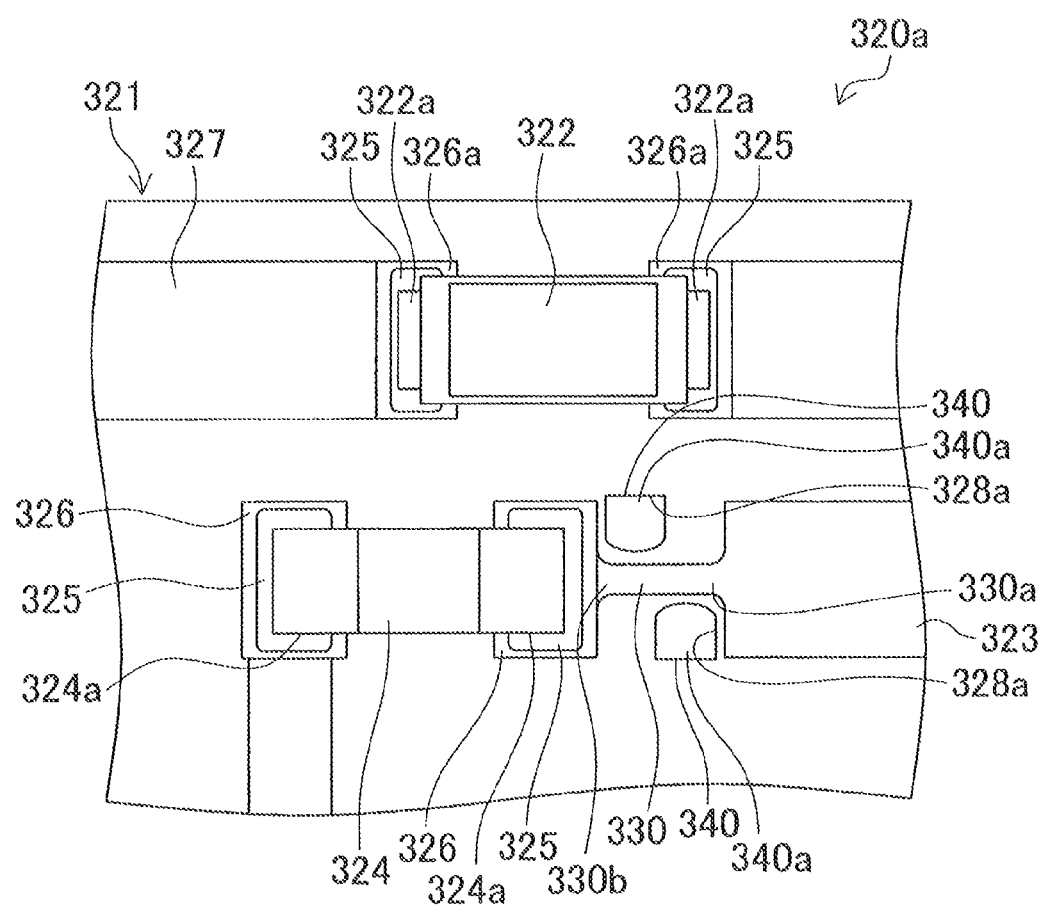
FIG. 35 is a diagram showing a part of a traction control device according to a first modification of the eleventh embodiment.

A traction control device 320a according to a first modification of the eleventh embodiment will be described with reference to FIG. 35. As shown in FIG. 35, in the traction control device 320a, one adherent wire 340 and one opening portion 328a may be defined adjacent to an end portion of the interrupt wire 330, which is adjacent to the land 326. Thus, a space between the land 326 and the adherent wire 340 is smaller than a space between the power supply wire 323 and the adherent wire 340. Additionally, the other adherent wire 340 and the other opening portion 328a may be defined adjacent to the other end portion of the interrupt wire 330, which is adjacent to the power supply wire 323. Thus, a space between the power supply wire 323 and the other adherent wire 340 is smaller than a space between the land 326 and the other adherent wire 340.

By the above-described configuration, when the melt conductor generated by melting of the interrupt wire 330 flows disproportionately to any one side of the adherent wires 340, the melt conductor adheres to the adherent wire 340 having a larger space between the adherent wire 340 and the power supply wire 323 or to the other adherent wire 340 having a larger space between the adherent wire 340 and the land 326. Thus, a short-circuit fault occurs due to coupling of the land 326 and the power supply wire 323 via the melt conductor on the adherent wire 340 can be avoided.

Figure 36:
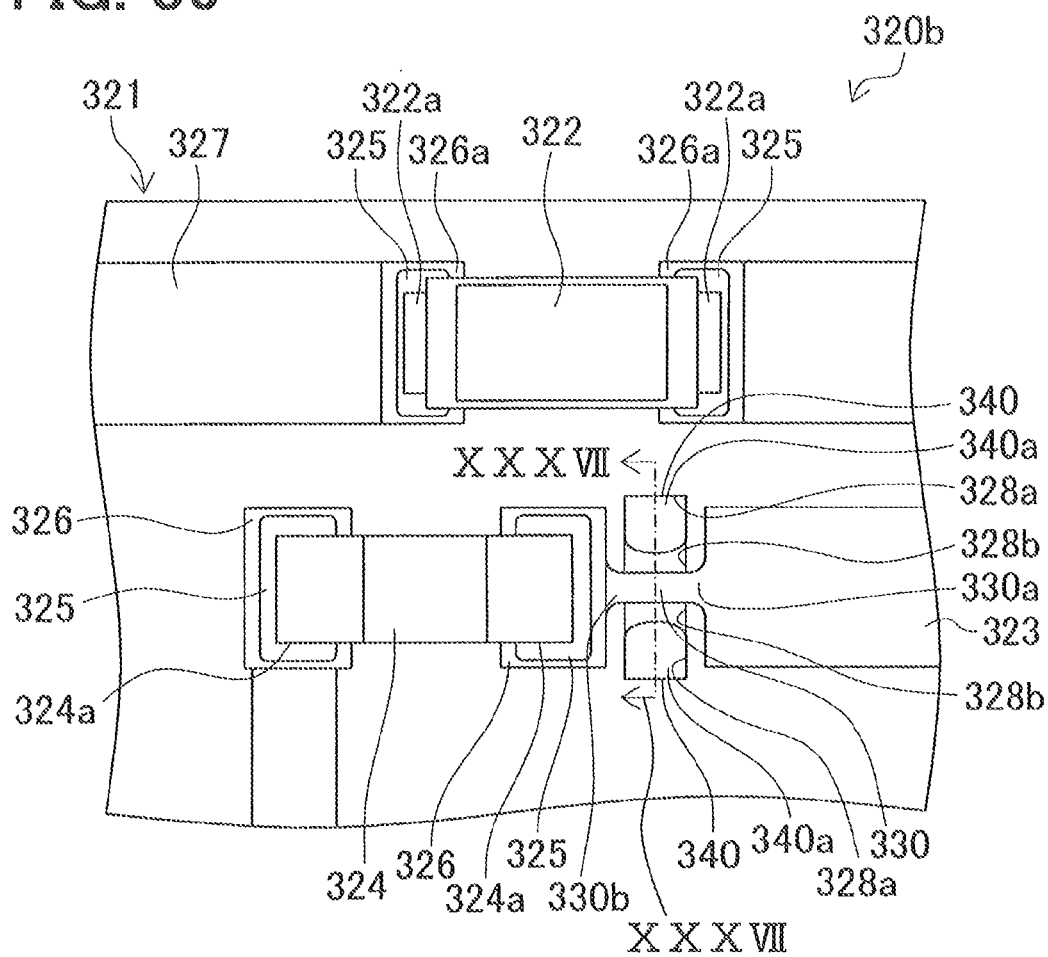
FIG. 36 is a diagram showing a part of a traction control device according to a second modification of the eleventh embodiment.
Figure 37:
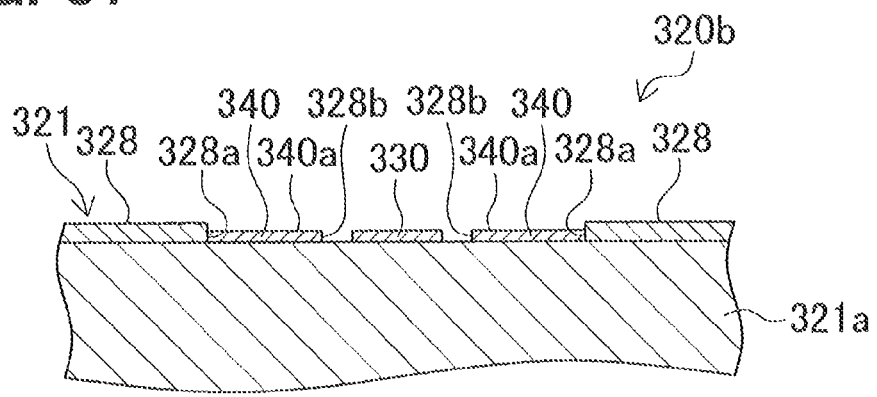
FIG. 37 is a cross-sectional view of the traction control device taken along line XXXVII-XXXVII in FIG. 36.

A traction control device 320b according to a second modification of the eleventh embodiment will be described with reference to FIG. 36 and FIG. 37. As shown in FIG. 36, the traction control device 320b may include lead paths 328b disposed between the interrupt wire 330 and the adherent wires 340. As shown in FIG. 37, the solder resist layer 328 formed between the two adherent wires 340 is removed in such a manner that the adherent wires 340, a middle portion of the interrupt wire 330 and the insulating layer 321a between the interrupt wire 330 and the two adherent wires 340 are exposed outside. The exposed portions of the insulating layer 321a between the interrupt wire 330 and the two adherent wires 340 provide the lead paths 328b.

By the above-described configuration, the lead paths 328b lead the melt conductor generated by melting of the interrupt wire 330 to the adherent wires 340, which are disposed on a same plane with the interrupt wire 330, and the melt conductor adheres to the adherent wires 340. As described above, because the lead paths 328b smoothly lead the melt conductor to the adherent wires 340, the melt conductor adheres to the adherent wires 340 with certainty.

Figure 38:
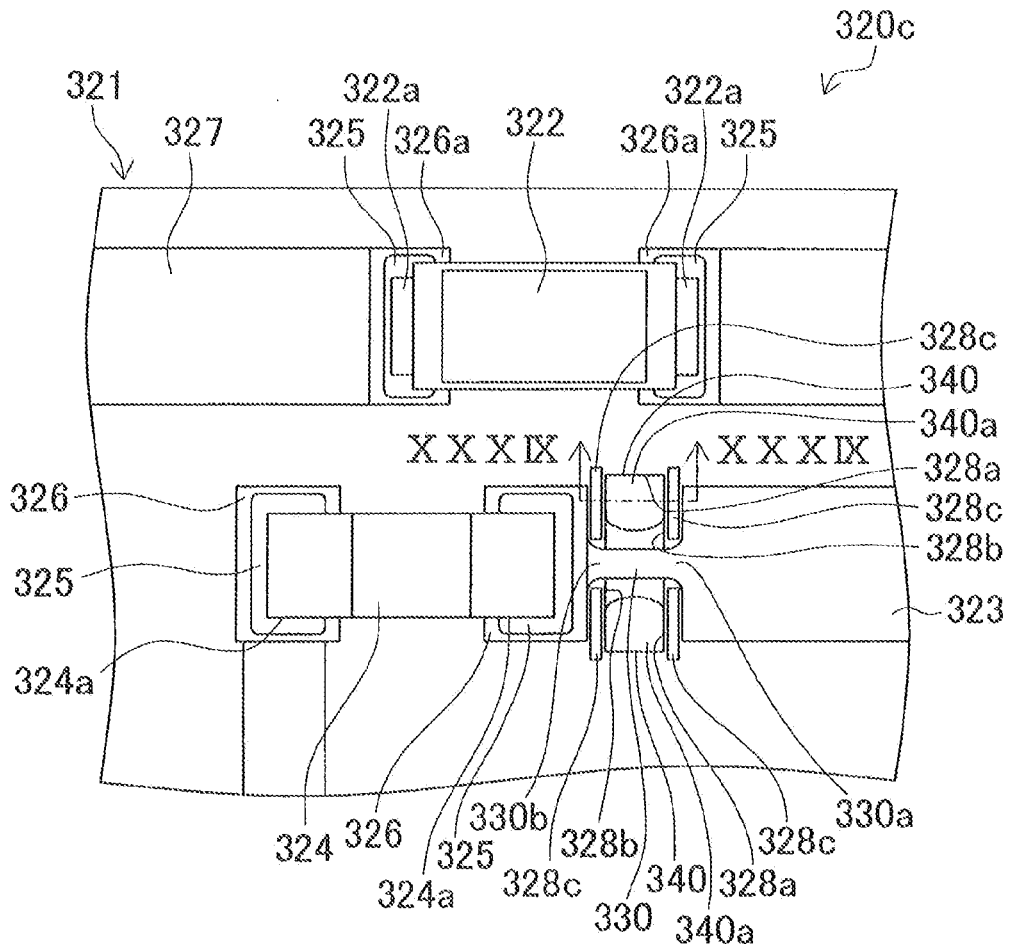
FIG. 38 is a diagram showing a part of a traction control device according to a third modification of the eleventh embodiment.
Figure 39:
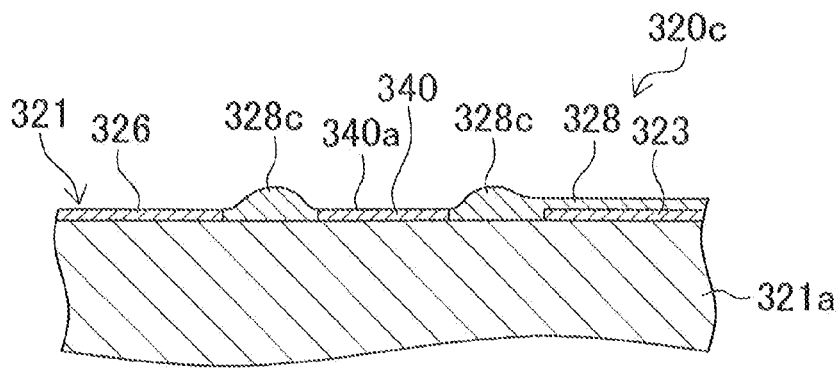
FIG. 39 is a cross-sectional view of the traction control device taken along line XXXIX-XXXIX in FIG. 38.

A traction control device 320c according to a third modification of the eleventh embodiment will be described with reference to FIG. 38 and FIG. 39. As shown in FIG. 38 and FIG. 39, the traction control device 320c may include convex portions 328c in addition to the lead paths 328b. On the solder resist layer 328, portions between the land 326 and the adherent wires 340 and portions between the power supply wire 323 and the adherent wires 340 have convex shape by stacking multiple layers of the solder resist layer 328 and provide the convex portions 328c.

By the above-described configuration, the lead paths 328b lead the melt conductor to the adherent wires 340, and the flow of the melt conductor from the adherent wires 340 is blocked by the convex portions 328c. Thus, the melt conductor adheres to the adherent wires 340. The convex portions 328c operate as blocking walls that blocks the flow of the melt conductor from the adherent wires 340. By disposing the convex portions 328c, a short-circuit fault occurs due to coupling of the land 326 and the power supply wire 323 via the melt conductor on the adherent wire 340 can be avoided and the melt conductor is held by the adherent wires 340 with certainty.

As described above, the convex portions 328c are formed by stacking multiple layers of the solder resist layer 328. Alternatively, the convex portions 328c may be formed by silkscreen printing in which a heat-resistant ink is used. The convex portion 328c may be formed to surround the adherent wire 340 or formed to partially surround the adherent wire 340 according to a flow direction of the melt conductor by removing a part of the convex portion formed adjacent to the interrupt wire 330.

Figure 40:
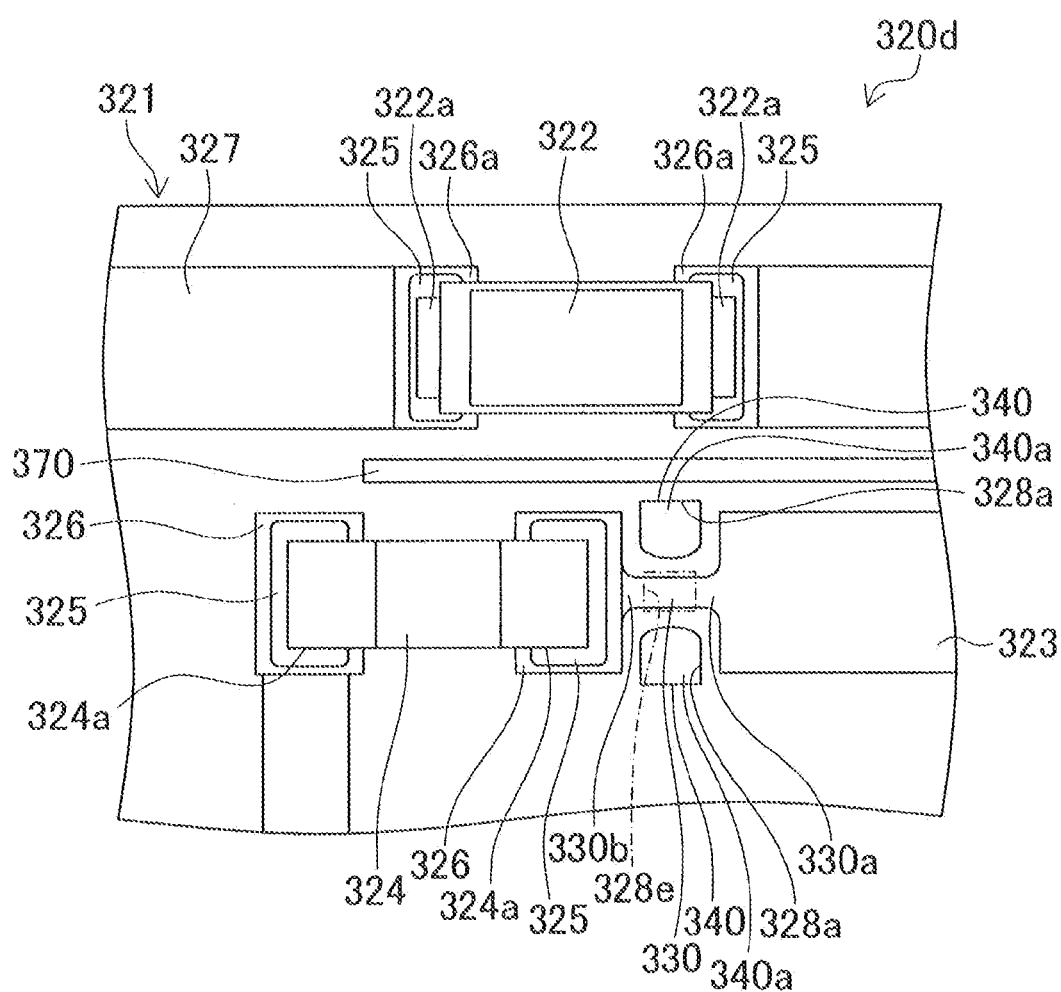
FIG. 40 is a diagram showing a part of a traction control device according to a fourth modification of the eleventh embodiment.

A traction control device 320d according to a fourth modification of the eleventh embodiment will be described with reference to FIG. 40. As shown in FIG. 40, in the traction control device 320d, the solder resist layer 328 may define an opening portion 328e so that at least a portion of the interrupt wire 330 is exposed outside. Specifically, the solder resist layer 328 defines the opening portion 328e in such a manner that a middle portion of an entire length of the interrupt wire 330, which is most likely to generate heat, is exposed outside. Reasons for providing the opening portion 328e in the solder resist layer 328 are similar to the reasons for providing the opening portion 28a in the solder resist layer 28, which are described in the first embodiment.

Thus, when at least a part of the interrupt wire 330 is exposed through the opening portion 328e, the melting time t decreases, the overcurrent protection action can be achieved early, and a temperature rise of a protected component can be restricted. Furthermore, a time for which a voltage of the power supply wire 323 decreases due to interruption by the interrupt wire 330 can be reduced. In addition, because the variation of the melting time t decreases, a capacity of a stabilizing capacitor that is designed in view of the melting time of the interrupt wire 330 in each device or each circuit can be reduced, and a cost and a size can be reduced. Furthermore, because the melting time t decreases also in a rated region of current, a circuit can be designed more freely.

Additionally, as a heat release member, a heat release wire 370 for releasing heat generated at the interrupt wire 330 by an overcurrent may be disposed between the interrupt wire 330 and the electronic component 322. The heat release wire 370 is made of conductive material, such as copper, in a manner similar to the component-coupling wire 327. The heat release wire 370 is extended in such a manner that the electronic component 322 and the interrupt wire 330 are separated by the heat release wire 370.

In the traction control device 320d, the melt conductor generated by melting of the interrupt wire 330 flows from the opening portion 328e. Accordingly, the melt conductor is less likely to stay at a position of the interrupt wire 330 before melting, variations in the melt position and the melting time due to stay of the melt conductor can be restricted, and the decrease in the interrupt performance by the interrupt wire 330 can be restricted.

Further, the opening portion 328e is defined by the solder resist layer 328 in such a manner that the interrupt wire 330 is exposed outside at a portion, which is most likely to generate heat. Thus, the opening portion 328e is defined at a portion corresponding to an easily meltdown portion in the interrupt wire 330 and the stay of the melt conductor at the position of the interrupt wire 330 before melting is restricted with certainty. Accordingly, the decrease in the interrupt performance by the interrupt wire 330 can be restricted with certainty.

Because the heat generated by the overcurrent in the interrupt wire 330 is released by the heat release wire 370, and the heat is less likely to be transmitted to the electronic component 322 to be protected against the heat. Thus, the electronic component 322 is secured from the heat and can operate normally.

(Twelfth Embodiment)

A traction control device 320e according to a twelfth embodiment of the present disclosure will be described with reference to FIG. 41 and FIG. 42.

The traction control device 320e according to the present embodiment includes adherent wires 341.

Figure 41:
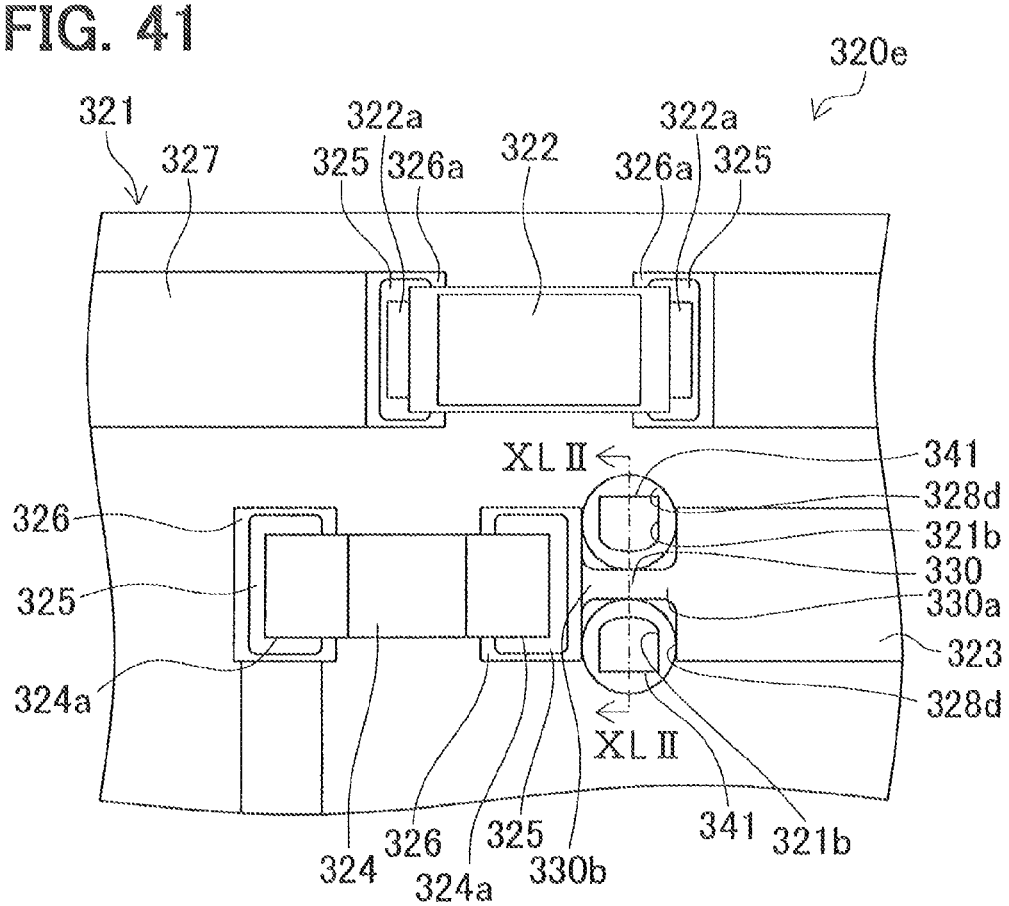
FIG. 41 is a diagram showing a part of a traction control device according to a twelfth embodiment of the present disclosure.
Figure 42:
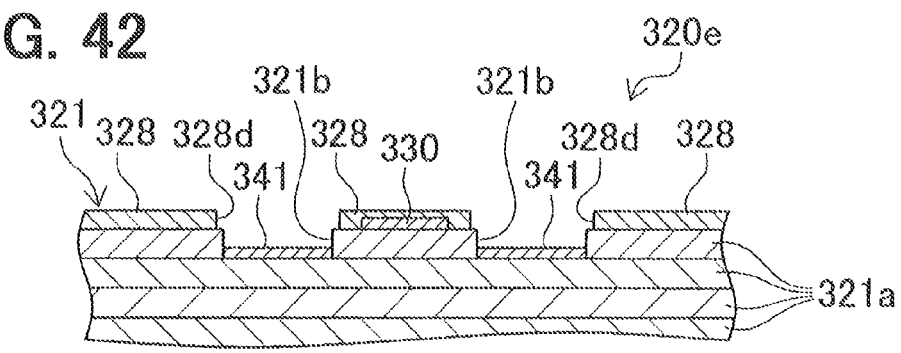
FIG. 42 is a cross-sectional view of the traction control device taken along line XLII-XLII in FIG. 41.

As shown in FIG. 41 and FIG. 42, in the traction control device 320e, the circuit substrate 321 is a multi-layer substrate and is formed by stacking a plurality of insulating layers 321a in layers and disposing a plurality of conductive layers on a surface of the insulating layers 321a. A surface of the circuit substrate 321 is defined as an upside of the circuit substrate 321, and an internal portion of the circuit substrate 321 is defined as a downside of the circuit substrate 321 for convenience of describing.

The adherent wires 341 are disposed between a first insulating layer 321a from the upside and a second insulating layer 321a from the upside. The adherent wires 341 are provided by the conductive layer, and are made of copper in a manner similar to the interrupt wire 330. The first insulating layer 321a defines two holes 321b at regions surrounded by the land 326, the interrupt wire 330 and the power supply wire 323 so that the circuit substrate 321 has depressed portions. The solder resist layer 328 defines two circular opening portions 328d corresponding to the holes 321b. By the holes 321b and the opening portions 328d, the adherent wires 341 are exposed outside. That is, the adherent wires 341 are disposed under the holes 321b.

By the above-described configuration, the melt conductor flows into the holes 321b disposed adjacent to the interrupt wire 330 and stays in the holes 321b. When the melt conductor stays in the holes 321b, the melt conductor adheres to the adherent wires 341 disposed under the holes. Thus, the melt conductor is held by the adherent wires 341 with certainty, and stays in the holes 321b.

Figure 43:
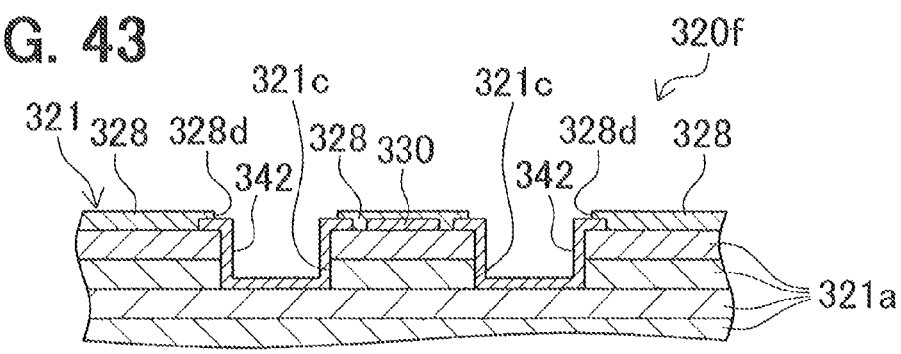
FIG. 43 is a cross-sectional view of a traction control device according to a modification of the twelfth embodiment.

A traction control device 320f according to a modification of the twelfth embodiment will be described with reference to FIG. 43. As shown in FIG. 43, the traction control device 320f may include layer connecting portions 321c and adherent wires 342. The layer connecting portions 321c are defined by the first insulating layer 321a from the upside and the second insulating layer 321a from the upside. Inner walls and bottoms of the layer connecting portions 321c are covered with the interrupt wire 342. Thus, when the melt conductor flows into the layer connecting portions 321c, the melt conductor adheres to not only the inner walls but also the bottoms of the layer connecting portions 321c. Accordingly, the melt conductor stays in the layer connecting portions 321c with certainty.

(Thirteenth Embodiment)

Figure 44:
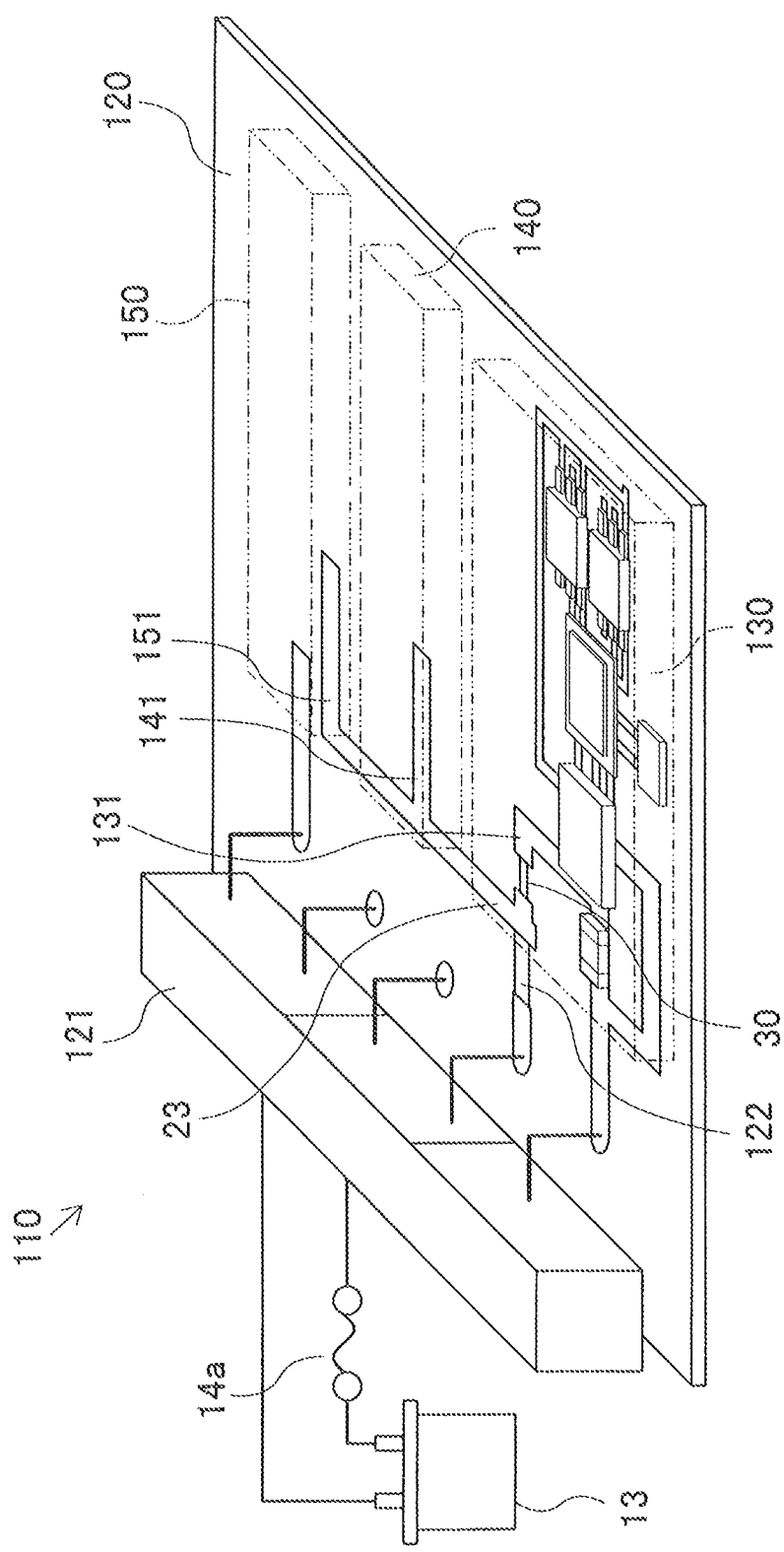
FIG. 44 is a diagram showing a part of a traction control device according to a thirteenth embodiment of the present disclosure.

An electronic control device 110 according to a thirteenth embodiment of the present disclosure will be described with reference to FIG. 44. The electronic control device 110 includes a substrate 120 and circuit blocks 130, 140, 150 disposed on the substrate 120. The circuit block 130 performs a similar function to the traction control device 20 according to the first embodiment. The circuit blocks 140, 150 perform different functions from the circuit block 130. The different functions are more important than the function of the circuit block 130. For example, the circuit block 140 performs a function corresponding to the engine ECU, and the circuit block 150 performs a function corresponding to the brake ECU.

The circuit blocks 130, 140, 150 are electrically coupled with the power supply wire 23, which supplies electric power from the battery 13, via branch wires 131, 141, 151, respectively. The above-described interrupt wire 30 is disposed on the branch wire 131 coupled with the circuit block 130 so as to function as overcurrent protection for the circuit block 130. On the power supply wire 23, an interrupt wire 122 that functions as overcurrent protection for the substrate 120 is disposed. In other words, the interrupt wire 122, which protects the substrate 120 including all the circuit blocks 130-150, and the interrupt wire 30, which protects the circuit block 130, are disposed on the substrate 120.

Accordingly, even when overcurrent is caused by a short-circuit fault in the circuit block 130 and the interrupt wire 30 melts due to the overcurrent, the circuit blocks 140, 150 are still electrically coupled with the power supply wire 23 via the branch wires 141, 151. Thus, only the circuit block 130 coupled with the melt interrupt wire 30 stops and the circuit blocks 140, 150 keep operating. In particular, since the function of the circuit block 130 is less important than the functions of the circuit blocks 140, 150, influence of the stop of the less important circuit block 130 on the functions of the more important circuit blocks 140, 150 can be restricted. When an overcurrent is caused by a short-circuit fault in the circuit blocks 140, 150 without the interrupt wire 30, the overcurrent flows to the power supply wire 23, the interrupt wire 122 melts, and the circuit blocks 130, 140, 150 are deactivated. Thus, the overcurrent is less likely to flow to other circuit block.

Especially in a case where a wire width of the interrupt wire 30 is smaller than a wire width of the interrupt wire 122 so that a current value at interruption by the interrupt wire 30 is smaller than a current value at interruption by the interrupt wire 122, when an overcurrent is caused by a short-circuit fault in the circuit block 130, the interrupt wire 30 melts earlier than the interrupt wire 122 with certainty. Thus, the influence an other circuit blocks 140, 150 can be restricted with certainty. The above-described configuration including two interrupt wires on one substrate may be applied to other embodiments and modifications.

(Other Embodiments)

The present disclosure is not limited to the above-described embodiments and the above-described modifications may include various changes and modifications.

Each of the above-described interrupt wires 30, 30a, 30b may be electrically coupled with the common wire, which is shared by the electronic components 22 to be protected against overcurrent, instead of the power supply wire 23.

Each of the above-described interrupt wires 30, 30a, 30b, on which the opening portions 28a are defined, may also be electrically coupled with a component-mounted wire on which an electronic component is disposed, such as an internal layer fully covered with a protective layer made of, for example, solder resist.

Each of the above-described interrupt wires 30, 30a, 30b, on which the opening portions 28a are defined, may be provided for each substrate for overcurrent protection of the electronic control devices 12 including the engine ECU, the brake ECU, the steering ECU, the body ECU, and the navigation ECU.

At least a part of the interrupt wire 30 may be made of material, such as aluminum, having a lower thermal conductivity than the power supply wire 23 and the land 26. Accordingly, heat generated at the interrupt wire 30 by an overcurrent is less likely to be transmitted to the power supply wire 23 and the land 26, the variation in temperature rise of the interrupt wire 30 can be restricted, and the decrease in interrupt performance by the interrupt wire 30 can be restricted with certainty. Also each of the interrupt wires 30a and 30b may be made of material having a lower thermal conductivity than the power supply wire 23 and the land 26 so as to achieve similar effects.

Each of the above-described connection wires 240, 240a and 240b may be electrically coupled with the common wire, which is shared by the electronic components 222 to be protected against overcurrent, instead of the power supply wire 223.

Each of the above-described connection wires 250, 250a and 250b may also be electrically coupled with a component-mounted wire on which an electronic component is disposed, such as an internal layer fully covered with a protective layer.

The above-described interrupt wire 230 and connection wires 240 and 250 may be provided for each substrate for overcurrent protection of the electronic control devices 12 including the engine ECU, the brake ECU, the steering ECU, the body ECU, and the navigation ECU.

The above-described interrupt wire 230 and a pair of plate-like wires 260 and 270 may be provided for each substrate for overcurrent protection of the electronic control devices 12 including the engine ECU, the brake ECU, the steering ECU, the body ECU, and the navigation ECU.

At least a part of the interrupt wire 230 may be made of material, such as aluminum, having a lower thermal conductivity than the power supply wire 223 and the land 226. Accordingly, heat generated at the interrupt wire 230 by an overcurrent is less likely to be transmitted to the power supply wire 223 and the land 226, the variation in temperature rise of the interrupt wire 230 can be restricted, and the decrease in interrupt performance by the interrupt wire 230 can be restricted with certainty.

The above-described adherent wires 341 and 342 may be disposed on each side of the interrupt wire 330 in such a manner that one adherent wire is disposed adjacent to the end portion of the interrupt wire 330, which is adjacent to the land 326, and the other is disposed adjacent to the other end portion of the interrupt wire 330, which is adjacent to the power supply wire 323. Thus, relatively large spaces are provided between the adherent wire and the land 326, the power supply wire 323.

Each pair of the above-described adherent wires 340, 341, 342 may be provided for each substrate for overcurrent protection of the electronic control devices 12 including the engine ECU, the brake ECU, the steering ECU, the body ECU, and the navigation ECU.

What is claimed is:

1. An electronic control device comprising:
   a substrate;
   a plurality of component-mounted wires disposed on the substrate;
   a plurality of electronic components mounted on the respective component-mounted wires;
   a common wire disposed on the substrate and coupled with each of the electronic components;
   an interrupt wire coupled between one of the component-mounted wires and the common wire, the interrupt wire configured to melt in accordance with heat generated by an overcurrent so as to interrupt a coupling between the one of the component-mounted wires and the common wire via the interrupt wire; and
   a protective layer covering a surface of the substrate including the interrupt wire, the protective layer being provided by a solder resist;
   wherein the protective layer defines an opening portion so that a portion of the interrupt wire is exposed.

2. The electronic control device according to claim 1,
   wherein the protective layer defines the opening portion so that a portion of the interrupt wire, which is most likely to generate heat, is exposed.

3. The electronic control device according to claim 1,
   wherein the interrupt wire has a meandering shape,
   wherein the interrupt wire includes a middle portion of an entire length of the interrupt wire, and
   wherein the protective layer defines the opening portion so that the middle portion of the interrupt wire is exposed.

4. The electronic control device according to claim 1,
   wherein the protective layer defines the opening portion so that a portion of the common wire in addition to the portion of the interrupt wire is exposed.

5. The electronic control device according to claim 1,
   wherein one interrupt wire is disposed corresponding to one electronic component, and
   wherein the protective layer defines an opening portion so that a portion of each interrupt wire is exposed.

6. The electronic control device according to claim 1,
   wherein the opening portion is defined so that the portion of the interrupt wire is exposed as a first opening portion,
   wherein the protective layer further defines a second opening portion so that a region adjacent to the interrupt wire is exposed, and
   wherein the first opening portion and the second opening portion are communicated with each other.

7. The electronic control device according to claim 6,
   wherein the second opening portion is shaped deeper than the first opening portion.

8. The electronic control device according to claim 7,
   wherein a depth of the second opening portion gradually increases from an end of the second opening portion at which the first opening portion and the second opening portion are communicated with each other to the other end of the second opening portion.

9. The electronic control device according to claim 6, further comprising
   an adherent member exposed through the second opening portion, the adherent member configured so that a melt conductor generated by melting of the interrupt wire adheres to the adherent member.

10. The electronic control device according to claim 1, further comprising
    an adherent member disposed adjacent to the interrupt wire compared with others of the electronic components so that the others of the electronic components except one of the electronic components interrupted by the interrupt wire are protected from a melt conductor generated by melting of the interrupt wire, the adherent member configured so that a melt conductor generated by melting of the interrupt wire adheres to the adherent member.

11. The electronic control device according to claim 10, further comprising
    another adherent member,
    wherein the adherent member and the another adherent member face to each other, and the interrupt wire is disposed between the adherent member and the another adherent member.

12. The electronic control device according to claim 11,
    wherein the adherent member is disposed adjacent to one end portion of the interrupt wire and the another adherent member is disposed adjacent to the other end portion of the interrupt wire.

13. The electronic control device according to claim 10,
    wherein the adherent member is provided by an adherent wire disposed on the substrate, and
    wherein the adherent wire is covered with a metal having a lower melting point than a melting point of the interrupt wire.

14. The electronic control device according to claim 13,
    wherein a solder is used as the metal.

15. The electronic control device according to claim 10, further comprising
    a lead path provided by removing the protective layer at a portion between the interrupt wire and the adherent member, the lead path configured to lead the melt conductor to the adherent member,
    wherein the interrupt wire and the adherent member are disposed on a same plane.

16. The electronic control device according to claim 10,
    wherein the substrate has a depressed portion, and
    wherein the adherent member is disposed in the depressed portion of the substrate.

17. The electronic control device according to claim 16,
    wherein the substrate includes a plurality of layers,
    wherein the adherent member is disposed in an internal portion of the substrate, and
    wherein the layers of the substrate define a hole at the depressed portion, the hole is configured to expose the adherent member.

18. The electronic control device according to claim 17,
    wherein a layer connecting portion is disposed as the hole, and
    wherein the adherent member is disposed on an inner wall of the layer connecting portion.

19. The electronic control device according to claim 10,
    wherein in the adherent member, at least a periphery portion facing to the electronic component coupled with the interrupt wire or facing to an opposite side of the electronic component coupled with the interrupt wire has a convex shape.

20. The electronic control device according to claim 1, further comprising
    a connection wire via which the interrupt wire is coupled with a coupling object that is one of the common wires or one of the component-mounted wires,
    wherein the connection wire has a first end portion adjacent to the interrupt wire and a second end portion adjacent to the coupling object, and
    wherein a cross-sectional area of the first end portion is smaller than a cross-sectional area of the second end portion.

21. The electronic control device according to claim 20,
wherein the second end portion includes a narrow-down portion adjacent to the coupling object and a middle portion between the first end portion and the narrow-down portion, and
wherein a cross-sectional area of the narrow-down portion is smaller than a cross-sectional area of the middle portion.

22. The electronic control device according to claim 1, further comprising
a heat release portion attached to the common wire and made of the same material as the common wire,
wherein a wire distance between the interrupt wire and the heat release portion is shorter than a wire distance between the interrupt wire and any of the electronic components except for one of the electronic components mounted on the one of the component-mounted wires.

23. The electronic control device according to claim 1, further comprising
a heat release portion disposed adjacent to the interrupt wire, the heat release portion configured to release heat generated at the interrupt wire by the overcurrent.

24. The electronic control device according to claim 1,
wherein the interrupt wire includes a first wire section and a second wire section that is shorter than the first wire section, and
wherein the first wire section and the second wire section are coupled with each other at a predetermined angle, the predetermined angle is determined so that one of the first wire section and the second wire section is coupled with the common wire and the other is coupled with the one of the component-mounted wires.

25. The electronic control device according to claim 1, further comprising
a connection wire via which the interrupt wire is coupled with a coupling object that is one of the common wires or one of the component-mounted wires,
wherein each side end of the connection wire is smoothly connected with corresponding side end of the interrupt wire and a wire width of the connection wire increases toward the coupling object.

26. The electronic control device according to claims 1,
wherein the common wire is a power supply wire.

27. A control system comprising:
a power supply path coupled with a power source;
a fuse disposed on the power supply path;
a device coupled with the power source by the power supply path via the fuse; and
the electronic control device according to claim 26,
wherein the power supply wire in the electronic control device is coupled with the power source by the power supply path via the fuse.

28. An electronic control device comprising:
a substrate;
a coupling object mounted on the substrate;
a connection wire coupled with the coupling object; and
an interrupt wire coupled with the coupling object via the connection wire, the interrupt wire configured to melt in accordance with heat generated by an overcurrent so as to interrupt a coupling with the coupling object,
wherein at least one side end of the connection wire is smoothly connected with corresponding side end of the interrupt wire and a wire width of the connection wire increases toward the coupling object, and
wherein the wire width of the connection wire increases toward the coupling object in an arc manner.

29. The electronic control device according to claim 28,
wherein one side end of the connection wire is smoothly connected with corresponding side end of the interrupt wire and the wire width of the connection wire increases toward the coupling object, and
wherein the other side end of the connection wire is linearly connected with corresponding side end of the interrupt wire.

* * * * *